(12) United States Patent
Sonoda

(10) Patent No.: US 6,240,375 B1
(45) Date of Patent: May 29, 2001

(54) METHOD OF SIMULATING AN INTEGRATED CIRCUIT FOR ERROR CORRECTION IN A CONFIGURATION MODEL, AND A COMPUTER-READABLE RECORDING MEDIUM

(75) Inventor: Kenichiro Sonoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/179,178

(22) Filed: Oct. 27, 1998

(30) Foreign Application Priority Data

Jun. 4, 1998 (JP) ............................................... P10-156084

(51) Int. Cl.[7] ...................................................... G06F 17/50
(52) U.S. Cl. ............................... 703/14; 716/11; 716/20; 700/110; 700/121
(58) Field of Search ....................... 703/14, 6, 2; 716/11, 716/15, 16, 19, 20, 21; 700/98, 110, 118–121

(56) References Cited

U.S. PATENT DOCUMENTS

| 5,416,729 | * | 5/1995 | Leon et al. ................................. 703/2 |
| 5,610,833 | * | 3/1997 | Chang et al. ........................... 716/11 |
| 5,627,772 | * | 5/1997 | Sonoda et al. ......................... 703/14 |
| 5,845,105 | * | 12/1998 | Kunikiyo et al. ........................ 703/6 |
| 5,901,062 | * | 5/1999 | Burch et al. ............................. 703/2 |

FOREIGN PATENT DOCUMENTS

| 3-89531 | 4/1991 | (JP) . |
| 5-89212 | 4/1993 | (JP) . |

OTHER PUBLICATIONS

Hieke, A., "Precise Chip and Package 3D Capacitance Simulations of Interconnects Using a General Purpose FEM– tool", Electrical Performance of Electronic Packaging, pp. 111–114, Oct. 1999.*

Raad et al., "Adaptive Modeling of the Transients of Submicron Itegrated Circuits", IEEE Transactions on Components, Packaging and Manufacturing Tech. Part A, vol. 21, Issue 3, pp. 412–417, Sep. 1997.*

Chang et al., "An Accurate Grid Local Truncation Error for Device Simulation", IEEE/ACM Inter. Conf. on Computer–Aided Design, 1993, pp. 275–282, Nov. 1993.*

(List continued on next page.)

*Primary Examiner*—Kevin J. Teska
*Assistant Examiner*—Douglas W. Sergent
(74) *Attorney, Agent, or Firm*—Oblon, Spivak, McClelland, Maier & Neustadt, P.C.

(57) ABSTRACT

The number (Nc) of conductor regions and the number (Ncell(i)) of cells constituting each conductor region (ci) are calculated from the result of a configuration simulation. Each conductor region (ci) is judged whether or not the number (Ncell(i)) of cells thereof is less than a minimum cell count (Ncellmin) for recognition as an electrode or interconnect line. A conductor region (ci) judged that the number (Ncell(i)) of cells is not less than the minimum cell count (Ncellmin) is regarded as the electrode or interconnect line. A conductor region (ci) judged that the number (Ncell(i)) of cells is less than the minimum cell count (Ncellmin) is replaced with a dielectric positioned on a previously set one of the top, bottom, left-hand, right-hand, front and rear sides of the conductor region (ci). For example, it is assumed that Nc=4, Ncell(1)=16, Ncell(2)=8, Ncell(3)=1, Ncell(4)=1, Ncellmin=5 and a conductor region having the number of cells less than the minimum cell count (Ncellmin) is replaced with a dielectric positioned on the top side of the conductor region, conductor regions (c1 and c2) are regarded as electrodes or interconnect lines and conductor regions (c3 and c4) are replaced with a dielectric ($\epsilon$3). After the processing of all conductor regions are complete, a capacitance simulation, for example, is performed precisely. The influences of errors caused by the configuration simulation using the cells are reduced for execution of another simulation.

19 Claims, 19 Drawing Sheets

OTHER PUBLICATIONS

Nagaraj et al., "Bridging the Gap Between TCAD and ECAD Methodologies in Deep Sub–Micron Interconnect Extraction and Analysis", Proc. 12th Inter. Conf. on VLSI Design, pp. 6–11, Jan. 1999.*

Aoyama et al., "A New Cahracterization of Sub–/spl mu/m Parallel Multilevel Interconnects and Its Experimental Verification", Proc. of the 1995 Inter. Conf. on Microelectronic Test Structures, pp. 63–66, Mar. 1995.*

* cited by examiner

CONDUCTOR

ELECTRODE OR INTERCONNECT LINE

CONDUCTOR

ELECTRODE OR
INTERCONNECT LINE

METHOD OF SIMULATING AN INTEGRATED CIRCUIT FOR ERROR CORRECTION IN A CONFIGURATION MODEL, AND A COMPUTER-READABLE RECORDING MEDIUM

BACKGROUND OF THE INVENTION

1. Field of the Invention

The present invention relates to a technique for evaluating the characteristics of devices and interconnect lines which constitute an integrated circuit by using simulation and, more particularly, to correction for configuration simulation.

2. Description of the Background Art

The degree of integration in integrated circuits (referred to hereinafter as "ICs") is becoming increasingly higher year by year, and the configuration and construction of semiconductor devices and interconnect lines are becoming finer and more complicated. The characteristics of the ICs significantly depend upon the properties of such internal devices and interconnect lines of the ICs. For example, a capacitance between electrodes of a MOSFET is greatly associated with the operating characteristics of a circuit in high-frequency ranges, and a parasitic capacitance between interconnect lines causes a signal delay. The uncertainty of physical quantities dependent upon the configuration and construction inside the ICs might cause operation failures such as a difference between an actual operating speed and an estimated operating speed when designed.

Thus, when ICs are designed, a large number of simulators are used to obtain predictable configurations and operations of the ICs being fabricated or having been fabricated. Examples of the simulators include: a process simulator for predicting changes in profiles at respective locations in an IC and changes in configurations of cross sections and surfaces in accordance with variations in parameters such as processing time in each step and a set temperature; a device simulator for calculating electrical parameters of devices based on information about an impurity profile, an oxide film configuration, and an electrode or interconnect line configuration; and a circuit simulator for verifying whether or not a circuit operates as designed. Simulation is repeated using these simulators to reproduce the predictable configurations and operations of the ICs as faithfully as possible for achieving optimum IC design.

Such simulation techniques include a capacitance simulation. The capacitance simulation calculates capacitances between electrodes or interconnect lines in a structure which further comprises dielectrics, by using a potential distribution and a charge amount distribution obtained by solving Laplace's equation and, if required, Poisson's equation, a current continuity equation, and a current drift and diffusion equation (which are referred to simply as "equations" hereinafter) by using numerical calculations. Solving the equations using the numerical calculations and determining the capacitance values have been widely studied as disclosed in, for example, Japanese Patent Application Laid-Open No. P03-89531A (1991) and Japanese Patent Application Laid-Open No. P05-89212A (1993).

The capacitance values depend on the charge amount distribution and the spatial potential distribution in the structure as above described. In other words, the capacitance values depend on the dielectric constant of dielectrics included in the given structure and on the configurations of the dielectrics and conductors. Thus, a high-accuracy simulation requires precise information about the structure.

There is a technique for determining resistance values and inductances in an IC based on the structure of the electrodes or interconnect line regions made of conductors. Similarly, this technique also requires precise information about the structure.

In particular, a demand for implementation of the capacitance simulation in a three-dimensional structure is increasing at present. However, three-dimensional complicated structures inside ICs are difficult to manually presume and are hence required to be determined by configuration simulation.

The configuration simulation is a technique for reproducing the configurations of fabricated semiconductor devices and interconnect lines in a simulative manner by providing information about masks used in IC wafer fabricating process steps and process conditions. The configuration simulation is performed using the above described process simulator. In the configuration simulation, a region to be analyzed is in many cases divided into minute regions referred to as cells for representation of the configuration thereof.

However, the configuration simulation technique using the cells is currently under study. Thus, if in particular a three-dimensional complicated structure is subjected to the configuration simulation, materials of metal parts, semiconductor substrate parts and the like which would be completely removed in an actual fabrication process are sometimes left unremoved as a result of the configuration simulation. This results from errors that occur because of the use of discrete configurations of the cells for calculation. Then, if the conductor regions provided by the configuration simulation are recognized simply as electrodes or interconnect lines, the subsequent simulation such as the capacitance simulation is performed under conditions different from those of the actual structure. In the case of the capacitance simulation, in particular, since the capacitance values are the physical quantities determined by the physical properties and arrangement of the conductor regions and a dielectric provided therebetween, the minute conductor regions created by the errors interfere with the increase in precision. A solution to such a problem has not yet been established.

SUMMARY OF THE INVENTION

A first aspect of the present invention is intended for a method of simulating an integrated circuit. According to the present invention, the method comprises the steps of: determining a structure of an integrated circuit in the form of a set of unit regions each having information about material and position thereof; recognizing a cell-coupled element comprised of at least one of the unit regions the material of which is a conductor as a conductor region to calculate the total number of conductor regions and the number of unit regions included in each conductor region; judging whether or not the number of unit regions included in each conductor region satisfies a criterion for regarding each conductor region as an electrode or interconnect line region; replacing the material of the at least one of the unit regions included in each conductor region which does not satisfy the criterion in the judging step with a nonconductor; and solving a predetermined equation using the information about the material and position of the unit regions including the at least one of the unit regions the material of which is replaced in the replacing step, to determine physical properties of the integrated circuit.

Preferably, according to a second aspect of the present invention, in the method of the first aspect, the criterion is such that the number of unit regions included in each conductor region is not less than a previously set value.

Preferably, according to a third aspect of the present invention, in the method of the second aspect, the set value is the product of the total number of unit regions within an entire region to be simulated in the integrated circuit and a predetermined rate.

Preferably, according to a fourth aspect of the present invention, in the method of the second aspect, the set value is the product of a maximum value of the number of unit regions included in each conductor region and a predetermined rate.

Preferably, according to a fifth aspect of the present invention, in the method of the first aspect, the criterion is such that the ranking of the conductor regions counted in descending order of the number of unit regions included in each conductor region is within a previously set value.

According to a sixth aspect of the present invention, a method of simulating an integrated circuit comprises the steps of: determining a structure of an integrated circuit in the form of a set of unit regions each having information about material and position thereof; recognizing a cell-coupled element comprised of at least one of the unit regions the material of which is a conductor as a conductor region to calculate the total number of conductor regions and to calculate the volume of each conductor region in the case of a three-dimensional simulation and the area of each conductor region in the case of a two-dimensional simulation; judging whether or not the volume of each conductor region satisfies a criterion for regarding each conductor region as an electrode or interconnect line region in the case of the three-dimensional simulation and judging whether or not the area of each conductor region satisfies a criterion for regarding each conductor region as the electrode or interconnect line region in the case of the two-dimensional simulation; replacing the material of the at least one of the unit regions included in each conductor region which does not satisfy the criterion in the judging step with a nonconductor; and solving a predetermined equation using the information about the material and position of the unit regions including the at least one of the unit regions the material of which is replaced in the replacing step, to determine physical properties of the integrated circuit.

Preferably, according to a seventh aspect of the present invention, in the method of the sixth aspect, the criterion in the case of the three-dimensional simulation is such that the volume of each conductor region is not less than a previously set value, and the criterion in the case of the two-dimensional simulation is such that the area of each conductor region is not less than a previously set value.

Preferably, according to an eighth aspect of the present invention, in the method of the seventh aspect, the set value in the case of the three-dimensional simulation is the product of the volume of an entire region to be simulated in the integrated circuit and a predetermined rate, and the set value in the case of the two-dimensional simulation is the product of the area of the entire region to be simulated in the integrated circuit and a predetermined rate.

Preferably, according to a ninth aspect of the present invention, in the method of the seventh aspect, the set value in the case of the three-dimensional simulation is the product of a maximum value of the volume of each conductor region and a predetermined rate, and the set value in the case of the two-dimensional simulation is the product of a maximum value of the area of each conductor region and a predetermined rate.

Preferably, according to a tenth aspect of the present invention, in the method of the sixth aspect, the criterion in the case of the three-dimensional simulation is such that the ranking of the conductor regions counted in descending order of the volume of each conductor region is within a previously set value, and the criterion in the case of the two-dimensional simulation is such that the ranking of the conductor regions counted in descending order of the area of each conductor region is within a previously set value.

Preferably, according to an eleventh aspect of the present invention, in the method of the first aspect, each conductor region to be replaced in the replacing step is adjacent to surrounding ones of the unit regions which have boundaries defining an outermost surface of each conductor region and is replaced with the material of one of the surrounding ones of the unit regions, the boundary of the one of the surrounding ones of the unit regions being oriented in a previously set direction.

Preferably, according to a twelfth aspect of the present invention, in the method of the first aspect, the replacing step comprises the steps of: determining the dimension of a boundary between each conductor region to be replaced and an adjacent region comprised of at least one of the unit regions which is adjacent to each conductor region for each material of the adjacent region; and replacing the material of each conductor region to be replaced with a type of the material providing a maximum boundary dimension.

A thirteenth aspect of the present invention is also intended for a computer readable recording medium which records thereon a program embodying the steps of: representing a structure of an integrated circuit in the form of a set of unit regions each having information about material and position thereof to recognize a cell-coupled element comprised of at least one of the unit regions the material of which is a conductor as a conductor region to calculate the total number of conductor regions; judging whether or not each conductor region satisfies a criterion for regarding each conductor region as an electrode or interconnect line region; replacing the material of the at least one of the unit regions included in each conductor region which does not satisfy the criterion in the judging step with a nonconductor; and solving a predetermined equation using the information about the material and position of the unit regions including the at least one of the unit regions the material of which is replaced in the replacing step, to determine physical properties of the integrated circuit.

In accordance with the first aspect of the present invention, the method of simulating an integrated circuit may eliminates discretization-induced errors in the structure of the integrated circuit determined as a set of unit regions each including information about the material and position thereof to determine the physical properties of the integrated circuit with high precision.

The method in accordance with the second aspect of the present invention provides effects similar to those of the first aspect. In particular, a higher-precision correction is made when the minimum number of unit regions for electrode or interconnect line recognition is known.

The method in accordance with the third aspect of the present invention provides effects similar to those of the first aspect. Additionally, a unified error judgement may be made independently of the dimension of a simulation region.

The method in accordance with the fourth aspect of the present invention provides effects similar to those of the first aspect. In particular, a high-precision correction is made even if the dimension ratio of each of the electrodes and interconnect lines to the range of the simulation is very small when the electrodes and interconnect lines do not have remarkably different dimensions.

The method in accordance with the fifth aspect of the present invention provides effects similar to those of the first aspect. In particular, a higher-precision correction is made when the total number of electrodes or interconnect lines within the entire simulation range is known.

In accordance with the sixth aspect of the present invention, the method of simulating an integrated circuit may eliminates discretization-induced errors in the structure of the integrated circuit determined as a set of unit regions each including information about the material and position thereof to determine the physical properties of the integrated circuit with high precision. In particular, the sixth aspect is effective when the unit regions have different volumes depending on the positions thereof.

The method in accordance with the seventh aspect of the present invention provides effects similar to those of the sixth aspect. In particular, a higher-precision correction is made when a minimum volume for the electrode or interconnect line recognition is known.

The method in accordance with the eighth aspect of the present invention provides effects similar to those of the sixth aspect. Additionally, a unified error judgement may be made independently of the dimension of the simulation region.

The method in accordance with the ninth aspect of the present invention provides effects similar to those of the sixth aspect. In particular, a high-precision correction is made even if the dimension ratio of each of the electrodes and interconnect lines to the range of the simulation is very small when the electrodes and interconnect lines do not have remarkably different dimensions.

The method in accordance with the tenth aspect of the present invention provides effects similar to those of the sixth aspect. In particular, a higher-precision correction is made when the total number of electrodes or interconnect lines within the entire simulation range is known.

The method in accordance with the eleventh aspect of the present invention may readily provide effects similar to those of the first to tenth aspects.

The method in accordance with the twelfth aspect of the present invention may more precisely provide effects similar to those of the first to tenth aspects.

In accordance with the thirteenth aspect of the present invention, the computer readable recording medium may allow a computer to embody an integrated circuit simulating method which eliminates discretization-induced errors in the structure of the integrated circuit determined as a set of unit regions each including information about the material and position thereof to determine the physical properties of the integrated circuit with high precision.

It is therefore an object of the present invention to provide a technique which eliminates discretization-induced errors caused in a configuration simulation using cells and which enhances the precision of the subsequent simulation such as a capacitance simulation.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
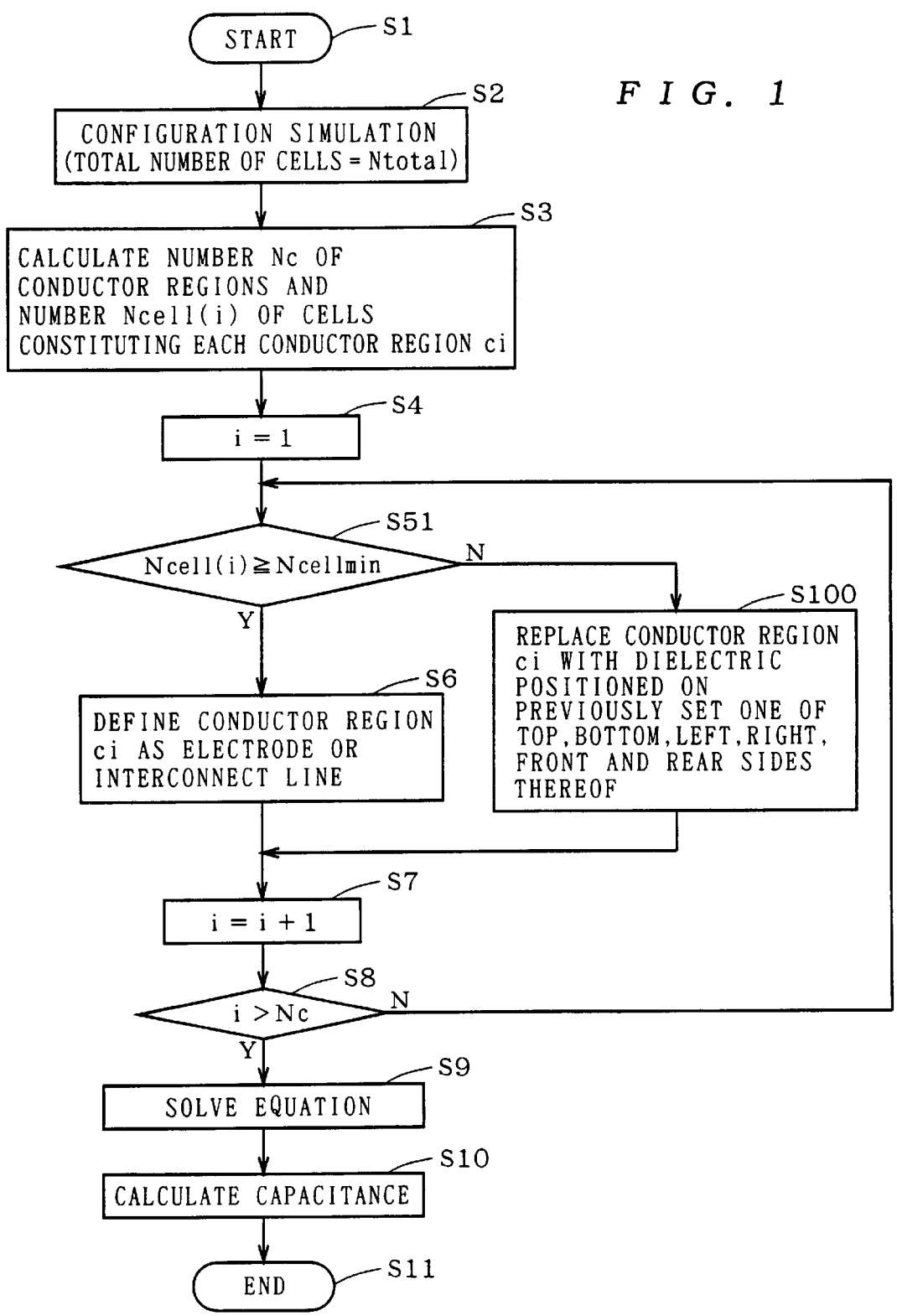
FIG. 1 is a flowchart showing the procedure of a first preferred embodiment according to the present invention.
Figure 2:
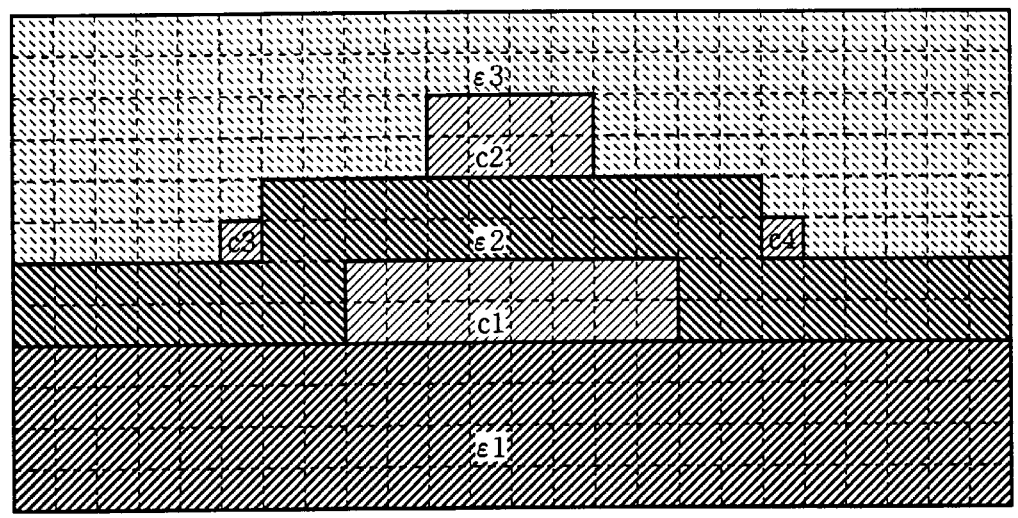
FIGS. 2 and 3 show examples of structures of the first preferred embodiment according to the present invention.
Figure 3:
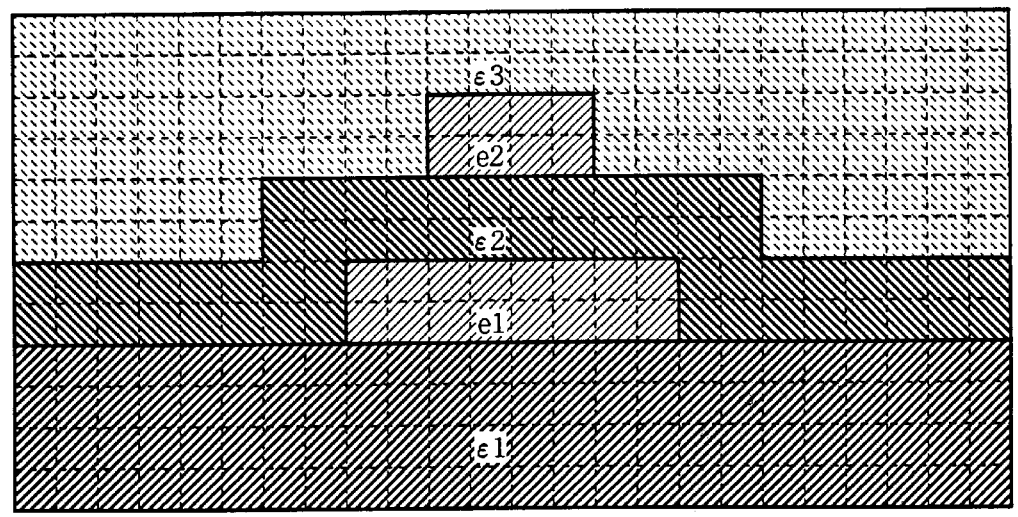

FIG. 1 is a flowchart showing the operation of a first preferred embodiment according to the present invention. FIGS. 2 and 3 conceptually illustrate the results of the operation shown in the flowchart of FIG. 1. Although two-dimensional cells are shown in FIGS. 2 and 3 for purposes of simplification, it is needless to say that three-dimensional cells may be similarly processed according to the present invention.

Initially, a known configuration simulation using cells is performed in the step S2. The reference character Ntotal designates the total number of cells. Information about the materials and positions of the respective cells is provided. In the step S3, conductor regions are extracted from the result of the configuration simulation, and the total number Nc of conductor regions and the number Ncell(i) of cells constituting each of the conductor regions ci are calculated (where i denotes numbers sequentially assigned to the respective conductor regions; the same is true in the subsequent description). The term "conductor region" used herein is meant to define a cluster of unit regions adjacent to each other and each made of a conductive material (which is referred to as a "cell-coupled element" herein).

FIG. 2 illustrates a result of the step S2. The reference characters c1 to c4 designate conductor regions, and the number Nc of conductor regions equals four. Then, the numbers of cells constituting the respective conductor regions are recognized as: Ncell(1)=16, Ncell(2)=8, Ncell(3)=1, and Ncell(4)=1.

The number i is initialized to "1" in the step S4. Then, judged in the step S51 is whether or not the number Ncell(i) of cells is less than a previously set minimum cell count Ncellmin which is the lowest number of cells required for the conductor region ci to be recognized as an electrode or interconnect line. If it is judged that the number Ncell(i) of cells is not less than the minimum cell count Ncellmin, the flow proceeds to the step S6 in which the conductor region ci is defined as the electrode or interconnect line. If it is judged that the number Ncell(i) of cells is less than the minimum cell count Ncellmin, the flow proceeds to the step S100 in which the conductor region ci is replaced with a dielectric $\epsilon k$ adjacent to one of the outermost surfaces of the conductor region ci which is oriented in a previously determined direction (where k denotes numbers assigned sequentially to the types of dielectrics; it is assumed that the number of types of dielectrics is km; the same is true in the subsequent description). The term "dielectric" used herein means a material which is non-conductive, and the term "outermost surface" means a surface of the cell-coupled element serving as the conductor region which is adjacent to a dielectric cell. Thus, a conductor cell which is surrounded by only conductor cells but lies in the conductor region judged as being to be replaced will be replaced with a given dielectric adjacent to one of the outermost surfaces of the conductor region.

In the step S7, the number i is incremented by one. The step S51 and the step S6 (or the step S100) are repeatedly executed until the number i exceeds the number Nc of conductor regions in the step S8. This allows all of the conductor regions ci to be either defined as an electrode or interconnect line or replaced with a dielectric $\epsilon k$ adjacent thereto.

FIG. 3 illustrates the result of operation when the step S51 and the step S6 (or the step S100) are repeatedly executed on the structure shown in FIG. 2 and the result of judgement in the step S8 is "Yes." It is assumed herein that the minimum cell count Ncellmin for the electrode or interconnect line recognition is set to "5" and that the conductor region ci is replaced with its adjacent dielectric $\epsilon k$ positioned on top of the conductor region ci. The conductor regions c1 and c2 are defined as electrodes or interconnect lines e1 and e2 respectively, and the conductor regions c3 and c4 are replaced with the dielectric $\epsilon 3$ positioned on top thereof.

The judgement that i>Nc in the step S8 means that all of the conductor regions ci have been subjected to the determination as to the electrode or interconnect line recognition. Then, in the step S9, an equation is solved for the structure including the electrodes or interconnect lines and the dielectrics. The capacitance between the electrodes or interconnect lines is determined in the step S10, and the processing is completed. Techniques known in the art may be used to solve the equation and to calculate the capacitance value.

The cells employed herein are cubic in configuration, and if the number Ncell(i) of cells is less than the minimum cell count Ncellmin, the conductor region ci may be replaced with a dielectric $\epsilon k$ including one of the cells positioned in opposed relation to the top, bottom, left-hand, right-hand, front and rear faces of the conductor region ci. When cells of other polyhedral configurations are employed, the conductor region ci may be replaced with its adjacent dielectric positioned in opposed relation to one of the faces of the conductor region ci which is oriented in a previously determined direction.

In this manner, the result of the known configuration simulation using cells is corrected in such a manner that the conductor region including the cells the number of which is less than the predetermined cell count is regarded as a configuration simulation error and handled as a nonconductor which in turn is replaced with a surrounding dielectric. This provides a configuration which is more analogous to the configuration of actual devices to accomplish a high-precision capacitance simulation. The first preferred embodiment of the present invention is particularly advantageous when the minimum number of unit regions which may be regarded as electrodes or interconnect lines is known.

Second Preferred Embodiment

Figure 4:
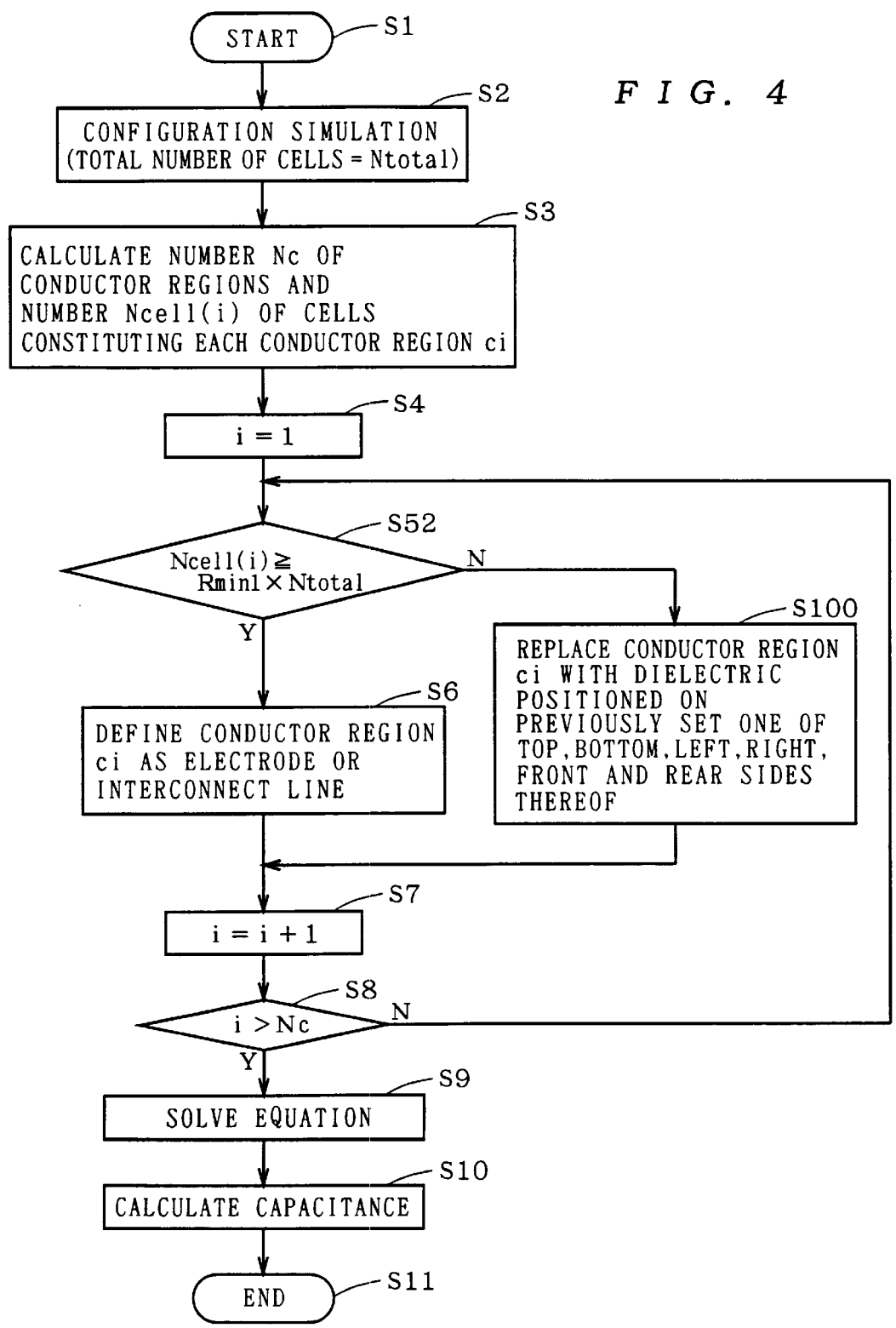
FIG. 4 is a flowchart showing the procedure of a second preferred embodiment according to the present invention.

FIG. 4 is a flowchart illustrating the operation of a second preferred embodiment according to the present invention. The second preferred embodiment differs from the first preferred embodiment in that a step S52 is provided in place of the step S51 of the first preferred embodiment. In the step S52, the product of the total number Ntotal of cells within a range subjected to the configuration simulation and a predetermined rate Rmin1 is used as the minimum cell count Ncellmin in the step S51. For instance, Ntotal=288 and Rmin1=0.02 are set to provide Ncellmin=5.76 in the case shown in FIGS. 2 and 3.

The second preferred embodiment, which uses the product of the total number Ntotal of cells and the predetermined rate Rmin1 to judge whether or not the conductor region is regarded as an error, may perform a high-precision capacitance simulation, like the first preferred embodiment. Additionally, the second preferred embodiment may make a unified error judgement independently of the dimension of the range of the configuration simulation.

Third Preferred Embodiment

Figure 5:
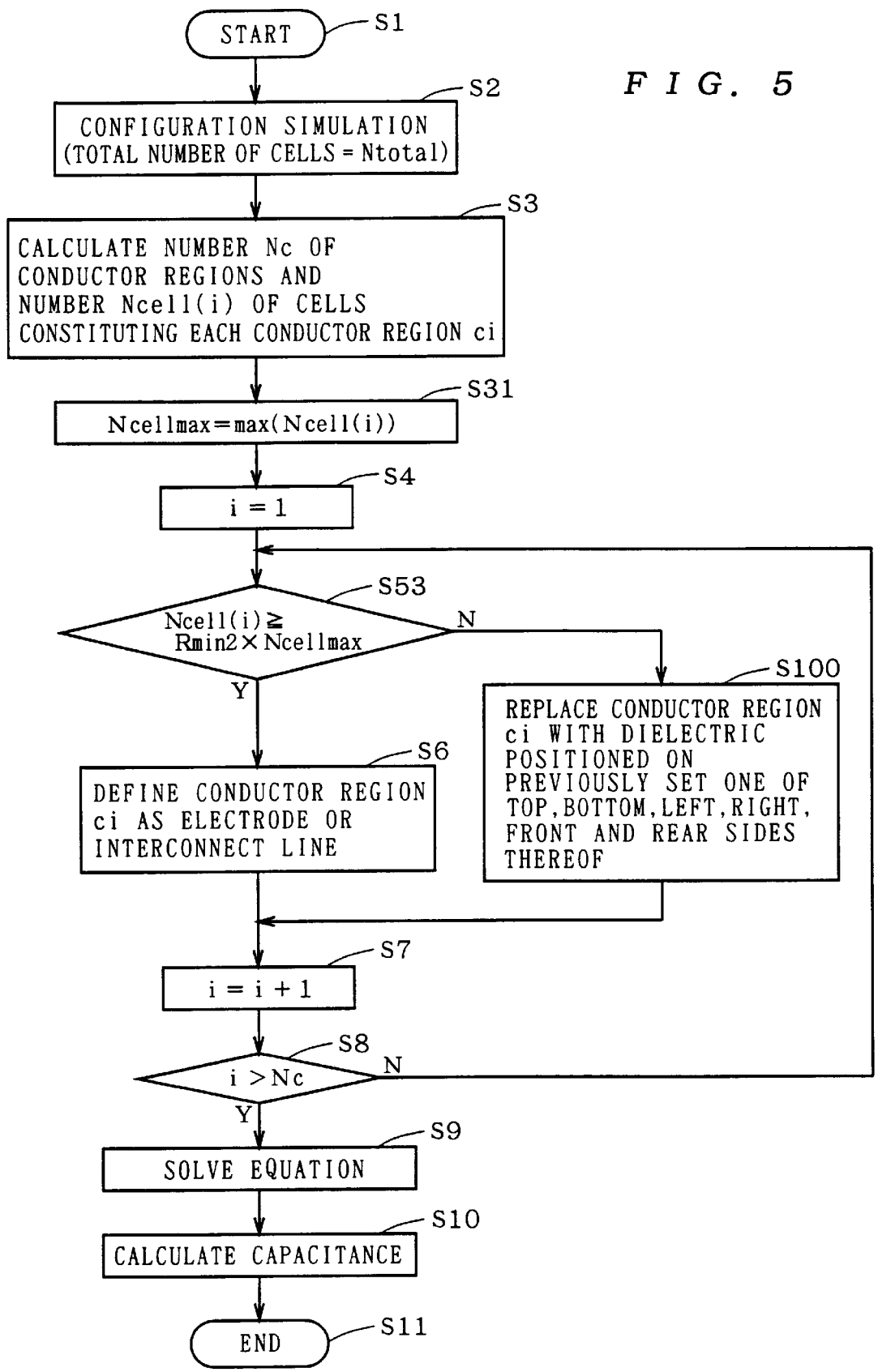
FIG. 5 is a flowchart showing the procedure of a third preferred embodiment according to the present invention.

FIG. 5 is a flowchart illustrating the operation of a third preferred embodiment according to the present invention. The third preferred embodiment differs from the first preferred embodiment in that a step S31 is inserted between the steps S3 and S4 of the first preferred embodiment and that a step S53 is provided in place of the step S51 of the first preferred embodiment.

In the step S31, a maximum value of the numbers Ncell(i) of cells of the respective conductor regions ci is set to Ncellmax. In the step S53, the product of the maximum value Ncellmax and a predetermined rate Rmin2 is used as the minimum cell count Ncellmin in the step S51. For instance, Ncellmax=Ncell(1)=16 and Rmin2=0.3 are set to provide Ncellmin=4.8 in the case shown in FIGS. 2 and 3.

The third preferred embodiment, which uses the product of the maximum value of the numbers Ncell(i) of cells of the conductor regions ci and the predetermined rate Rmin2 to judge whether or not the conductor region is regarded as an error, may perform a high-precision capacitance simulation, like the first preferred embodiment. Additionally, the third preferred embodiment is particularly advantageous even if the dimension ratio of each of the electrodes and interconnect lines to the range of the simulation is very small when the electrodes and interconnect lines do not have remarkably different dimensions.

Fourth Preferred Embodiment

Figure 6:
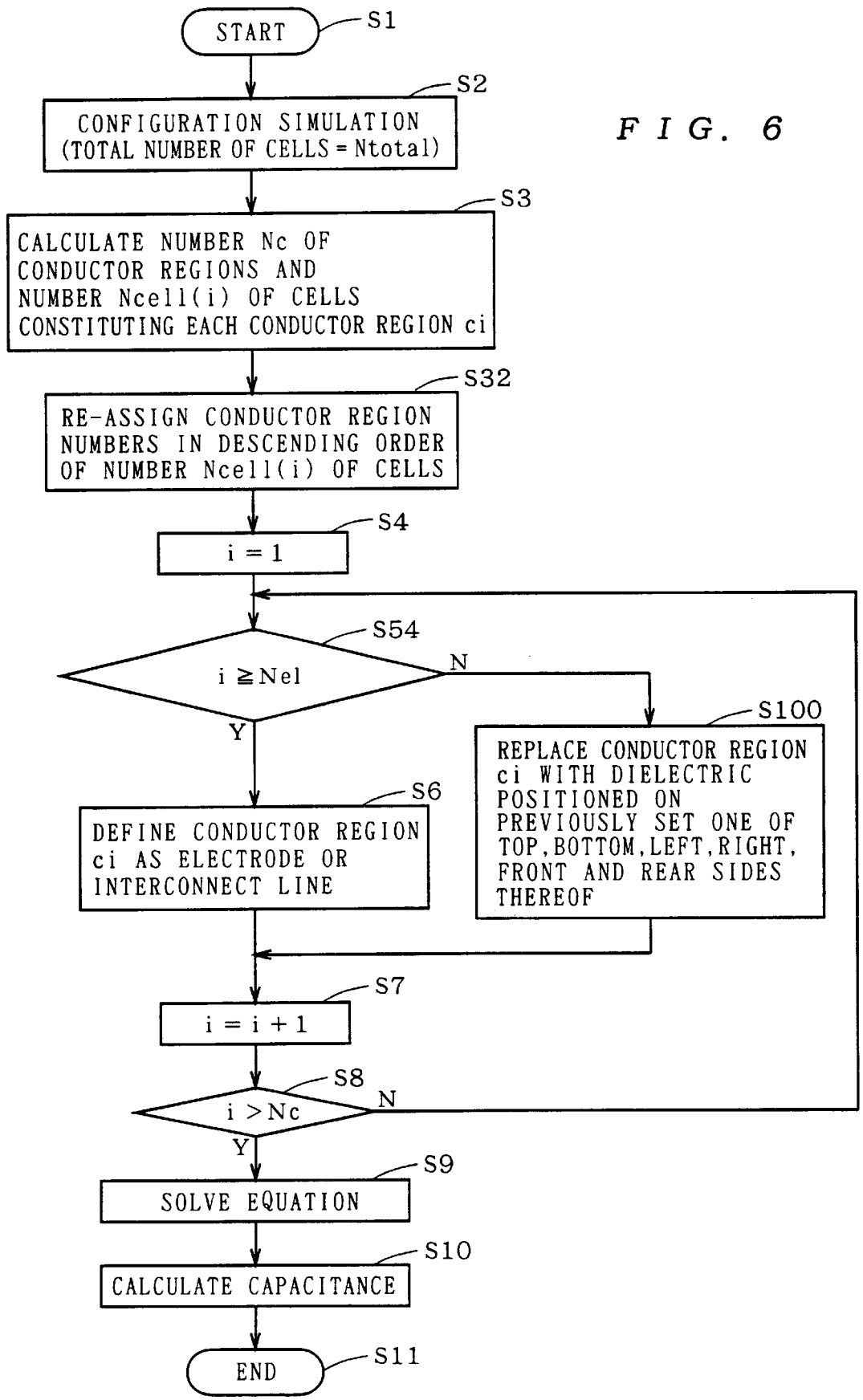
FIG. 6 is a flowchart showing the procedure of a fourth preferred embodiment according to the present invention.

FIG. 6 is a flowchart illustrating the operation of a fourth preferred embodiment according to the present invention.

The fourth preferred embodiment differs from the first preferred embodiment in that a step S32 is inserted between the steps S3 and S4 of the first preferred embodiment and that a step S54 is provided in place of the step S51 of the first preferred embodiment.

In the step S32, the conductor region numbers i of the conductor regions ci are re-assigned in descending order of the total number Ncell(i) of cells, that is, in the following order:

$$\text{Ncell}(1) \geq \text{Ncell}(2) \geq \ldots \geq \text{Ncell}(Nc) \quad (1)$$

In the step S54, the flow is caused to proceed to the step S6 for a previously established number Nel of conductor regions c1 to cNel which respectively have the highest to Nelth-highest numbers Ncell(i) of cells. The Nel conductor regions c1 to cNe1 are regarded as electrodes or interconnect lines in the step S6. In the step S54, the flow is caused to proceed to the step S100 for the other conductor regions cNel+1 to cNc. The conductor regions cNel+1 to cNc are replaced with their adjacent dielectrics $\epsilon k$ in the step S100.

The fourth preferred embodiment may perform a high-precision capacitance simulation, like the first preferred embodiment. Additionally, the fourth preferred embodiment may readily establish an error judgement criterion when the number of electrodes or interconnect lines in the range subjected to the configuration simulation is known.

Fifth Preferred Embodiment

Figure 7:
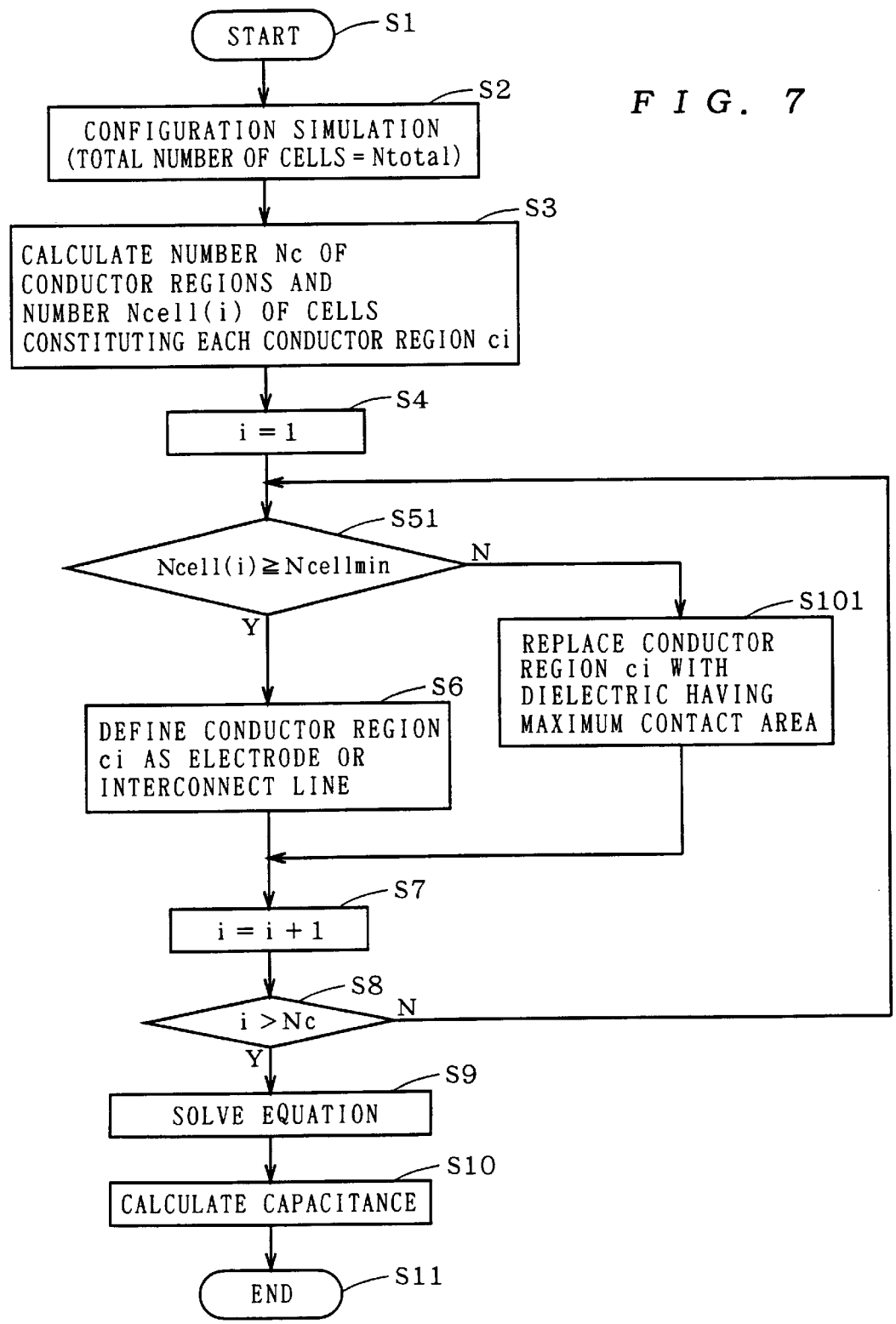
FIG. 7 is a flowchart showing the procedure of a fifth preferred embodiment according to the present invention.

FIG. 7 is a flowchart illustrating the operation of a fifth preferred embodiment according to the present invention. The fifth preferred embodiment differs from the first preferred embodiment in that a step S101 is provided in place of the step S100 of the first preferred embodiment. The step S101 is similar to the step S100 in that the conductor region ci is replaced with the dielectric $\epsilon k$ based on the judgement in the step S51, but differs therefrom in that in which direction the dielectric $\epsilon k$ to be substituted for the conductor region ci is positioned adjacent relative to the conductor region ci is determined according to circumstances.

Figure 8:
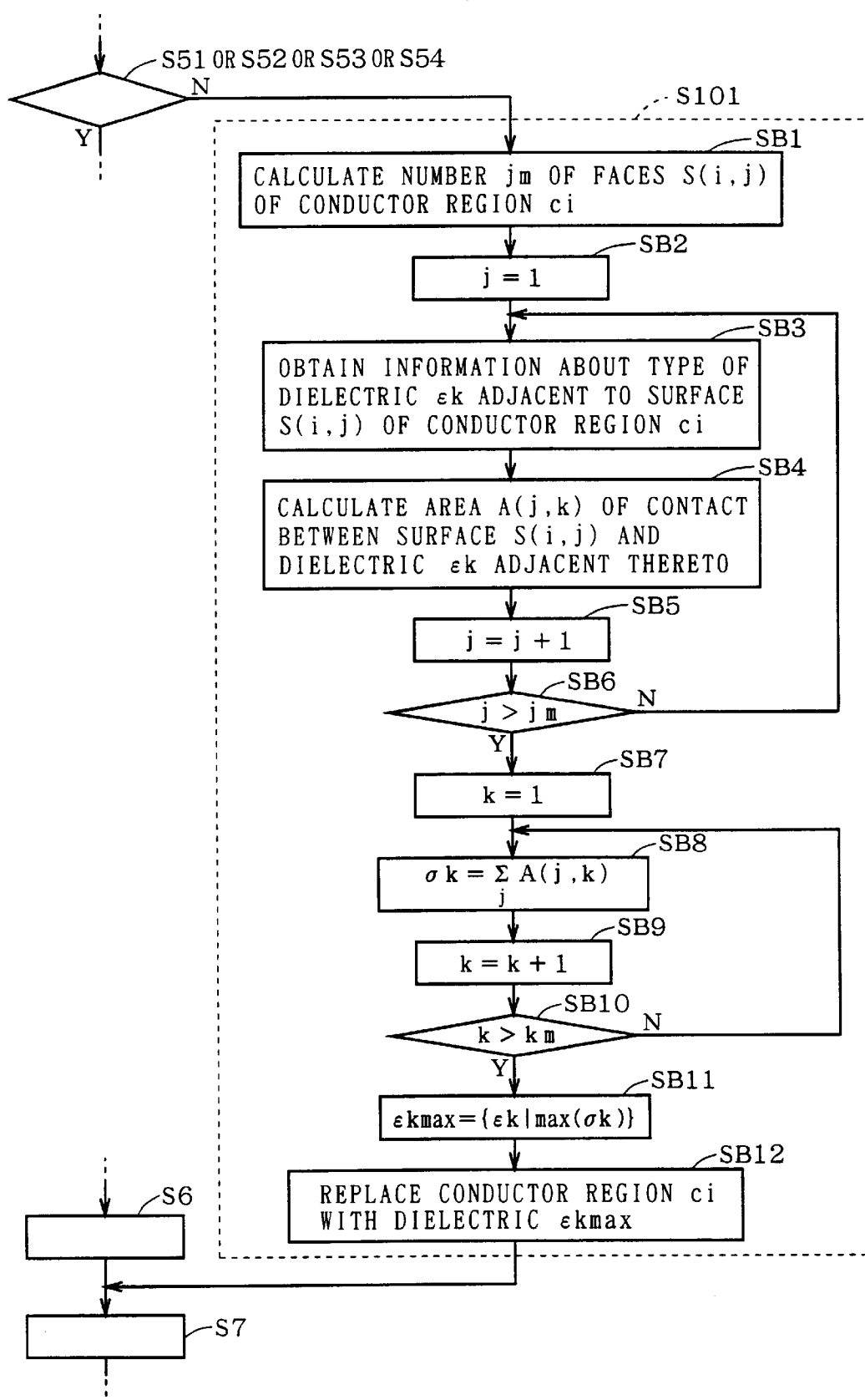
FIG. 8 is a flowchart showing parts of the procedure of the fifth to eighth, and thirteenth to sixteenth preferred embodiments according to the present invention.

FIG. 8 is a flowchart showing the contents of the step S101. Initially, in the step SB1, the faces S(i, j) of the conductor region ci are recognized (where j denotes numbers assigned sequentially starting with "1" for each conductor region ci), and the number jm of faces is calculated. Specifically, the conductor region ci has jm faces S(i, 1) to S(i, jm).

Then, the number j is initialized to "1" in the step SB2. In the step SB3, the type k of the dielectric $\epsilon k$ adjacent to the surface S(i, j) of the conductor region ci is recognized. Next, in the step SB4, the area A(j, k) of contact between the surface S(i, j) and the dielectric $\epsilon k$ adjacent thereto is calculated based on the number of cells of the dielectric $\epsilon k$ adjacent to the surface S(i, j).

The number j is incremented by one in the step SB5. Based on the judgement in the step SB6, the steps SB3 and SB4 are repeatedly executed upon all of the surfaces (i, 1) to S(i, jm) of the conductor region ci.

The number k is initialized to "1" in the step SB7. In the step SB8, the sum of the contact areas A(j, k) for each type k of the dielectric $\epsilon k$ is calculated. Specifically, $$\sigma k = \sum_{j=1}^{jm} A(j, k) \quad (2)$$

is calculated. Then, the total area $\sigma k$ of contact between the conductor region ci and the dielectric $\epsilon k$ adjacent thereto is provided. In this case, $\sigma q = 0$ where $k = q$ ($1 \leq q \leq km$) means herein that the dielectric $\epsilon q$ is not adjacent to the conductor region ci. The number k is incremented by one in the step SB9. Based on the judgement in the step SB10, the steps SB8 and SB9 are repeatedly executed upon all types of the dielectrics $\epsilon k$.

The dielectric $\epsilon k$ which provides the maximum value of the contact areas $\sigma k$ is set to $\epsilon k\max$ in the step SB11. The conductor region ci is replaced with the dielectric $\epsilon k\max$ in the step SB12.

There may be provided a solution to such a problem that a plurality of dielectrics provide the maximum value of the areas $\sigma k$. The solution includes, for example, selecting one of the dielectrics which is positioned at the highest level within the range of the configuration simulation result as a candidate for replacement.

Figure 9:
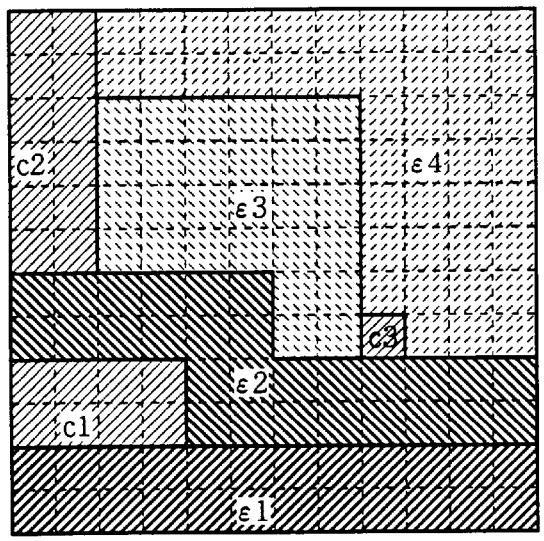
FIGS. 9 and 10 show examples of structures of the fifth preferred embodiment according to the present invention.
Figure 10:
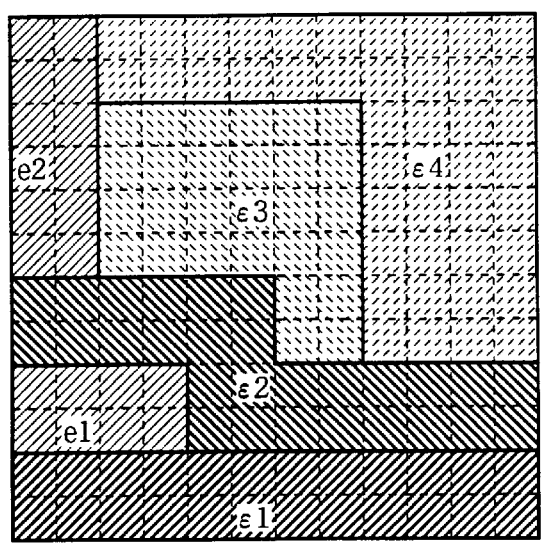

FIGS. 9 and 10 conceptually illustrate the operation results of the fifth preferred embodiment. FIG. 9 illustrates the result of the step S2, in which case the cells are two-dimensionally square in configuration. When the two-dimensional cells are used in this manner, the surface S(i, j) and the area A(j, k) are considered as a line S(i, j) and a side length A(j, k), respectively.

In FIGS. 9 and 10, the reference characters c1 to c3 designate conductor regions. The number of conductor regions is recognized as Nc=3, and the numbers of cells constituting the respective conductor regions are recognized as Ncell(1)=8, Ncell(2)=12 and Ncell(3)=1. The reference characters $\epsilon 1$ to $\epsilon 4$ designate dielectrics.

Assuming that the minimum cell count Ncellmin for the electrode or interconnect line recognition is set to "5", the conductor regions c1 and c2 are regarded as electrodes or interconnect lines. The conductor region c3 containing the cells the number of which is less than the minimum cell count Ncellmin is replaced with its adjacent dielectric having the maximum side length since the cells have a two-dimensional configuration.

The conductor region c3 has lines S(3, 1), S(3, 2), S(3, 3) and S(3, 4) respectively at the top, bottom, left and right thereof The result of execution of the step SB4 upon the conductor region c3 is specifically described below. The dielectric $\epsilon 4$ is adjacent to the line S(3, 1) at the top of the conductor region c3, but other dielectrics are not adjacent thereto. Then, A(1, 1)=A(1, 2)=A(1, 3)=0 and A(1, 4)=1. The dielectric $\epsilon 2$ is adjacent to the line S(3, 2) at the bottom of the conductor region c3, but other dielectrics are not adjacent thereto. Then, A(2, 1)=A(2, 3)=A(2, 4)=0 and A(2, 2)=1. Likewise, A(3, 1)=A(3, 2)=A(3, 4)=A(4, 1)=A(4, 2)=A(4, 3)=0 and A(3, 3)=A(4, 4)=1.

The result of the step SB8 is $\sigma 1=0$, $\sigma 2=\sigma 3=1$, and $\sigma 4=2$. The result of the step SB11 is $\epsilon k\max=\epsilon 4$. Then, the conductor region c3 is replaced with the dielectric $\epsilon 4$ in the step SB12. Finally, the structure shown in FIG. 10 is provided.

The fifth preferred embodiment may correct the result of the configuration simulation to perform a high-precision capacitance simulation, like the first preferred embodiment. Additionally, the fifth preferred embodiment replaces the conductor region with the dielectric having the greatest area of contact with the conductor region to provide a configuration which is more analogous to the configuration of the actual devices, accomplishing a higher-precision capacitance simulation.

The step S100 of the first preferred embodiment, of course, is desirable in terms of simplicity of determination of the dielectric for replacement.

Sixth Preferred Embodiment

Figure 11:
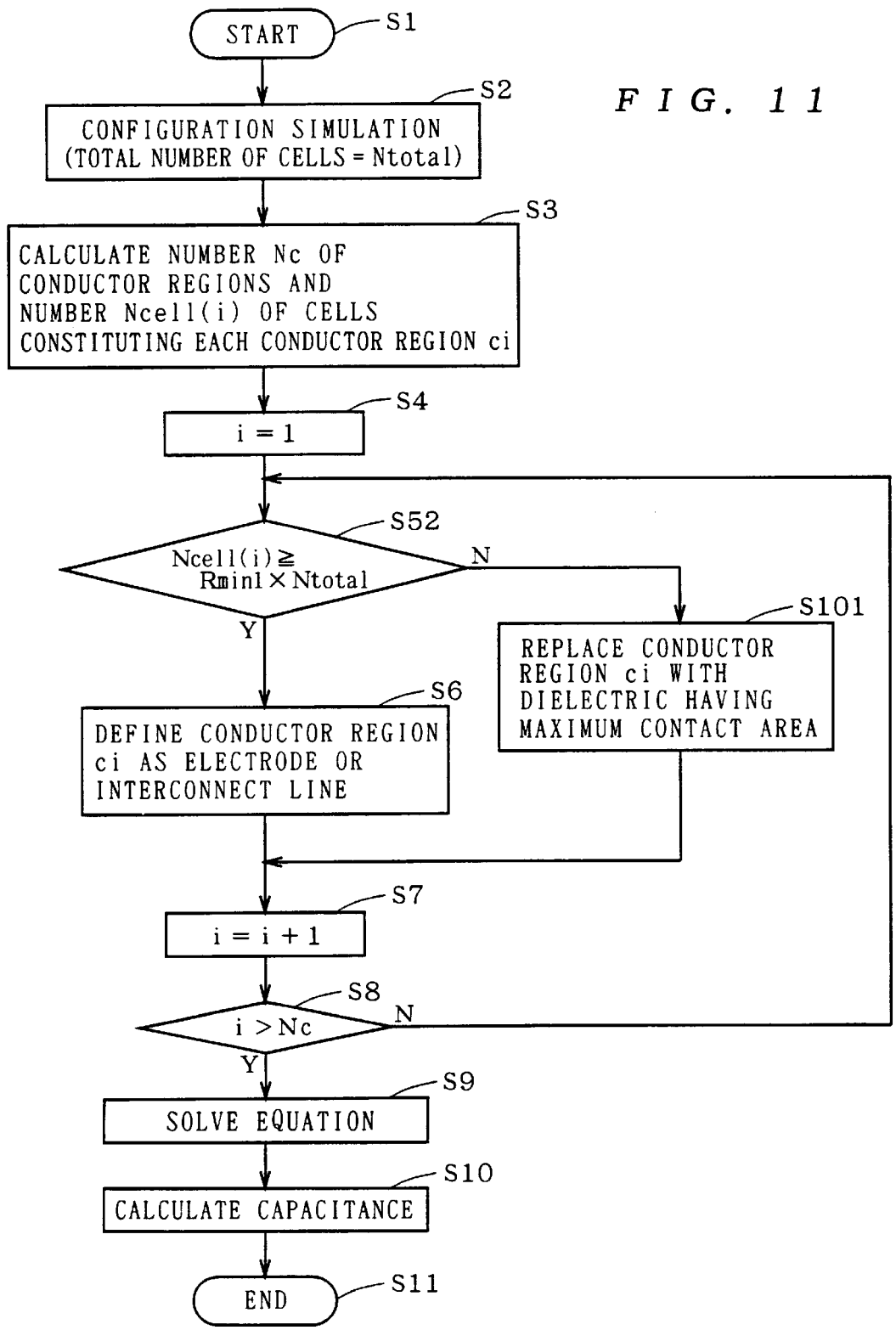
FIG. 11 is a flowchart showing the procedure of the sixth preferred embodiment according to the present invention.

FIG. 11 is a flowchart illustrating the operation of a sixth preferred embodiment according to the present invention.

The sixth preferred embodiment differs from the fifth preferred embodiment in that the step S52 of the second preferred embodiment is provided in place of the step S51 of the fifth preferred embodiment. In other words, the sixth preferred embodiment differs from the second preferred embodiment in that the step S101 of the fifth preferred embodiment is provided in place of the step S100 of the second preferred embodiment.

Therefore, the sixth preferred embodiment, similar to the fifth preferred embodiment, may perform a high-precision capacitance simulation. Additionally, the sixth preferred embodiment, similar to the second preferred embodiment, may make a unified error judgement independently of the dimension of the range of the configuration simulation.

Seventh Preferred embodiment

Figure 12:
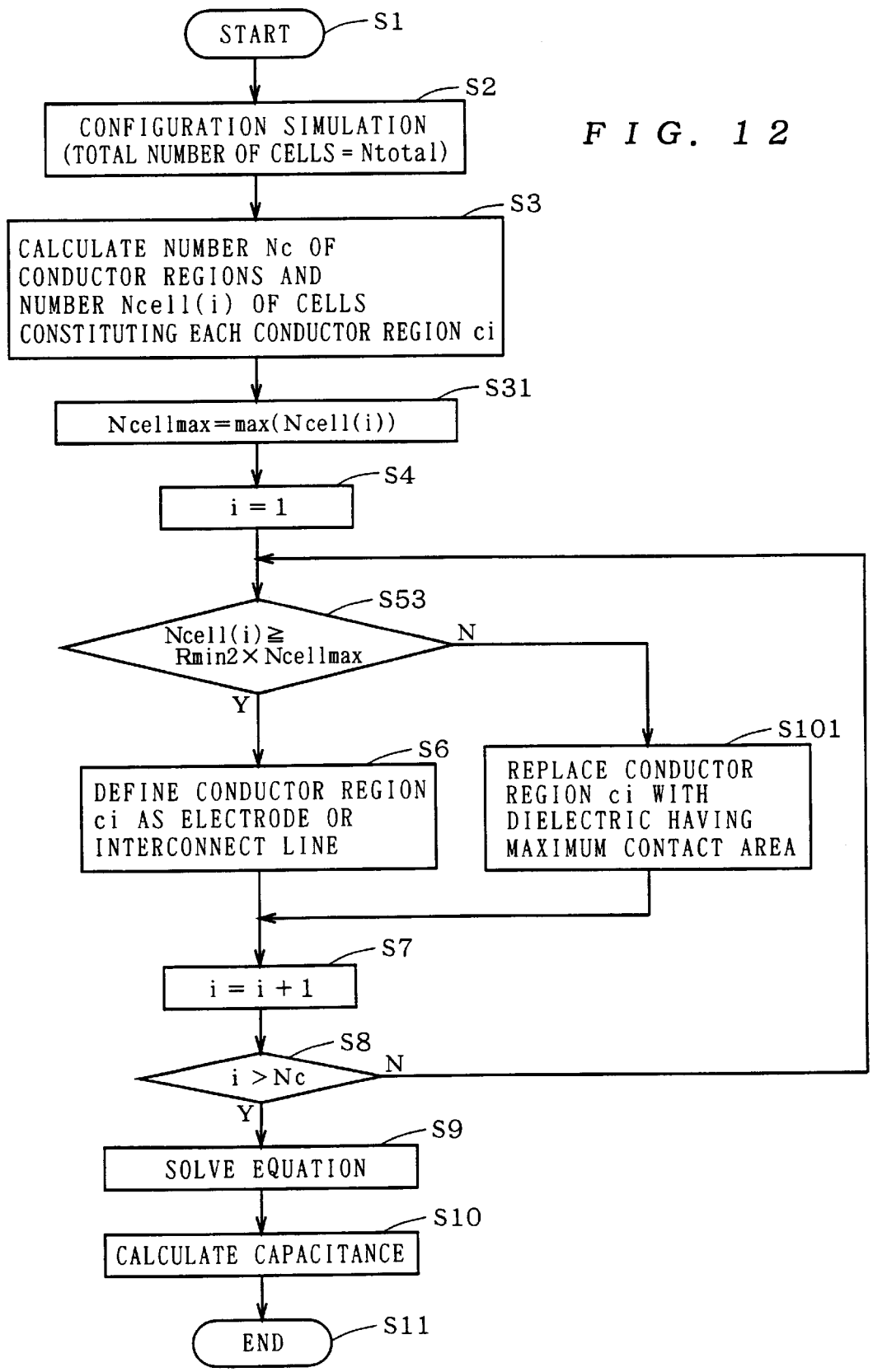
FIG. 12 is a flowchart showing the procedure of the seventh preferred embodiment according to the present invention.

FIG. 12 is a flowchart illustrating the operation of a seventh preferred embodiment according to the present invention. The seventh preferred embodiment differs from the fifth preferred embodiment in that the step S31 of the third preferred embodiment is inserted between the steps S3 and S4 of the fifth preferred embodiment and that the step S53 of the third preferred embodiment is provided in place of the step S51 of the fifth preferred embodiment. In other words, the seventh preferred embodiment differs from the third preferred embodiment in that the step S101 of the fifth preferred embodiment is provided in place of the step S100 of the third preferred embodiment.

Therefore, the seventh preferred embodiment, similar to the fifth preferred embodiment, may perform a high-precision capacitance simulation. Additionally, the seventh preferred embodiment, similar to the third preferred embodiment, is particularly advantageous even if the dimension ratio of each of the electrodes and interconnect lines to the range of the simulation is very small when the electrodes and interconnect lines do not have remarkably different dimensions.

Eighth Preferred Embodiment

Figure 13:
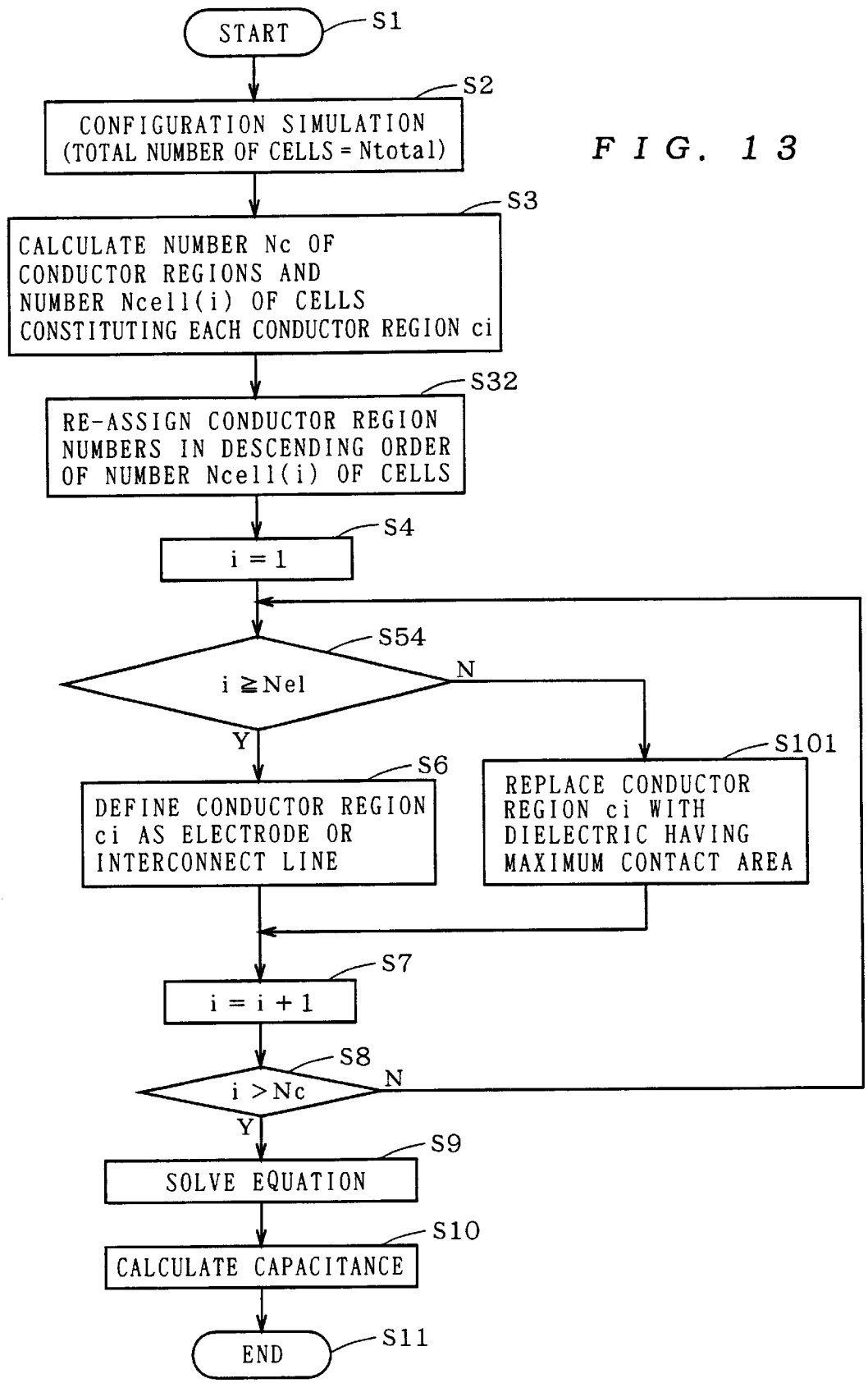
FIG. 13 is a flowchart showing the procedure of the eighth preferred embodiment according to the present invention.

FIG. 13 is a flowchart illustrating the operation of an eighth preferred embodiment according to the present invention. The eighth preferred embodiment differs from the fifth preferred embodiment in that the step S32 of the fourth preferred embodiment is inserted between the steps S3 and S4 of the fifth preferred embodiment and that the step S54 of the fourth preferred embodiment is provided in place of the step S51 of the fifth preferred embodiment. In other words, the eighth preferred embodiment differs from the fourth preferred embodiment in that the step S101 of the fifth preferred embodiment is provided in place of the step S100 of the fourth preferred embodiment.

Therefore, the eighth preferred embodiment, similar to the fifth preferred embodiment, may perform a high-precision capacitance simulation. Additionally, the eighth preferred embodiment, similar to the fourth preferred embodiment, may readily establish an error judgement criterion when the number of electrodes or interconnect lines in the range subjected to the configuration simulation is known.

Ninth Preferred Embodiment

Figure 14:
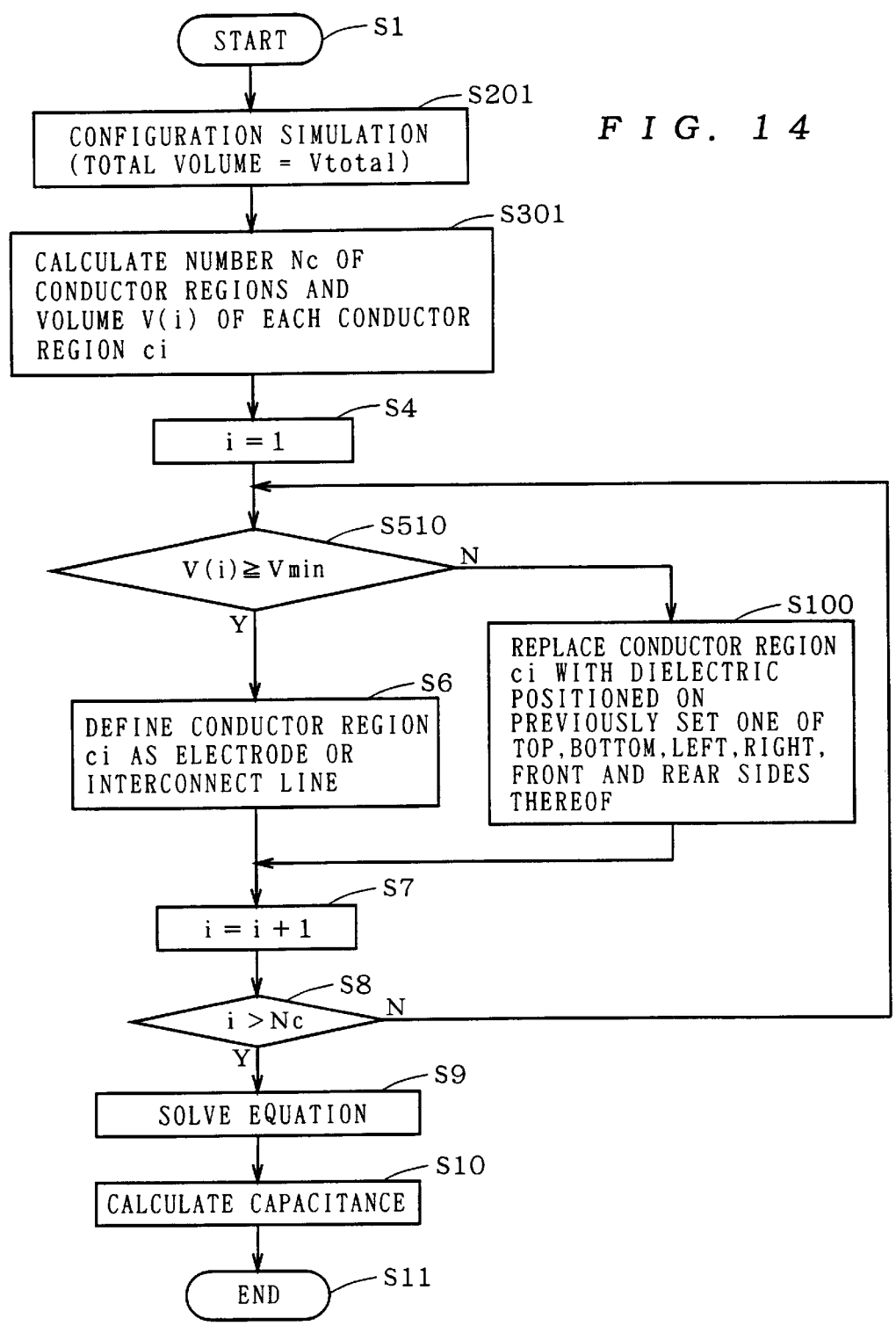
FIG. 14 is a flowchart showing the procedure of a ninth preferred embodiment according to the present invention.

FIG. 14 is a flowchart illustrating the operation of a ninth preferred embodiment according to the present invention.

Initially, a known configuration simulation using cells is performed in the step S201. The reference character Vtotal designates the total volume of the simulated region. Information about the materials and positions of the respective cells is provided. In the step S301, conductor regions are extracted from the result of the configuration simulation, and the total number Nc of conductor regions and the volume V(i) of each conductor region ci are calculated.

The number i is initialized to "1" in the step S4. Then, judged in the step S510 is whether or not the volume V(i) is less than a previously set minimum volume Vmin which is the lowest volume required for the conductor region ci to be recognized as an electrode or interconnect line. If it is judged that the volume V(i) is not less than the minimum volume Vmin, the flow proceeds to the step S6 in which the conductor region ci is defined as the electrode or interconnect line. If it is judged that the volume V(i) is less than the minimum volume Vmin, the flow proceeds to the step S100 in which the conductor region ci is replaced with a dielectric $\epsilon k$ adjacent to one of the outermost surfaces of the conductor region ci which is oriented in a previously determined direction. Thus, a conductor cell which is surrounded by only conductor cells but lies in the conductor region judged as being to be replaced will be replaced with a given dielectric adjacent to one of the outermost surfaces of the conductor region.

In the step S7, the number i is incremented by one. The step S510 and the step S6 (or the step S100) are repeatedly executed until the number i exceeds the number Nc of conductor regions in the step S8. This allows all of the conductor regions ci to be either defined as an electrode or interconnect line or replaced with a dielectric $\epsilon k$ adjacent thereto.

The judgement that i>Nc in the step S8 means that all of the conductor regions ci have been subjected to the determination as to the electrode or interconnect line recognition. Then, in the step S9, an equation is solved for the structure including the electrodes or interconnect lines and the dielectrics. The capacitance between the electrodes or interconnect lines is determined in the step S10, and the processing is completed. Techniques known in the art may be used to solve the equation and to calculate the capacitance value.

The cells employed herein are cubic in configuration, and if the volume V(i) is less than the minimum volume Vmin, the conductor region ci may be replaced with a dielectric $\epsilon k$ including one of the cells positioned in opposed relation to the top, bottom, left-hand, right-hand, front and rear faces of the conductor region ci. When cells of other polyhedral configurations are employed, the conductor region ci may be replaced with its adjacent dielectric positioned in opposed relation to one of the faces of the conductor region ci which is oriented in a previously determined direction.

In this manner, the result of the known configuration simulation using cells is corrected in such a manner that the conductor region having a volume less than the predetermined volume is regarded as a configuration simulation error and handled as a non-conductor which in turn is replaced with a surrounding dielectric. This provides a configuration which is more analogous to the configuration of actual devices to accomplish a high-precision capacitance simulation. The ninth preferred embodiment of the present invention is particularly advantageous when the minimum volume which may be regarded as electrodes or interconnect lines is known. Further, although description has been given herein based on the three-dimensional simulation, two-dimensional simulation may be employed, in which case the "volume" described above may be changed to "area" (the same is true in the subsequent description).

Furthermore, the ninth preferred embodiment, which makes the judgement about the replacement based on the volume of the conductor region rather than the number of cells, is effective when the cells have different volumes depending on the positions thereof.

Tenth Preferred Embodiment

Figure 15:
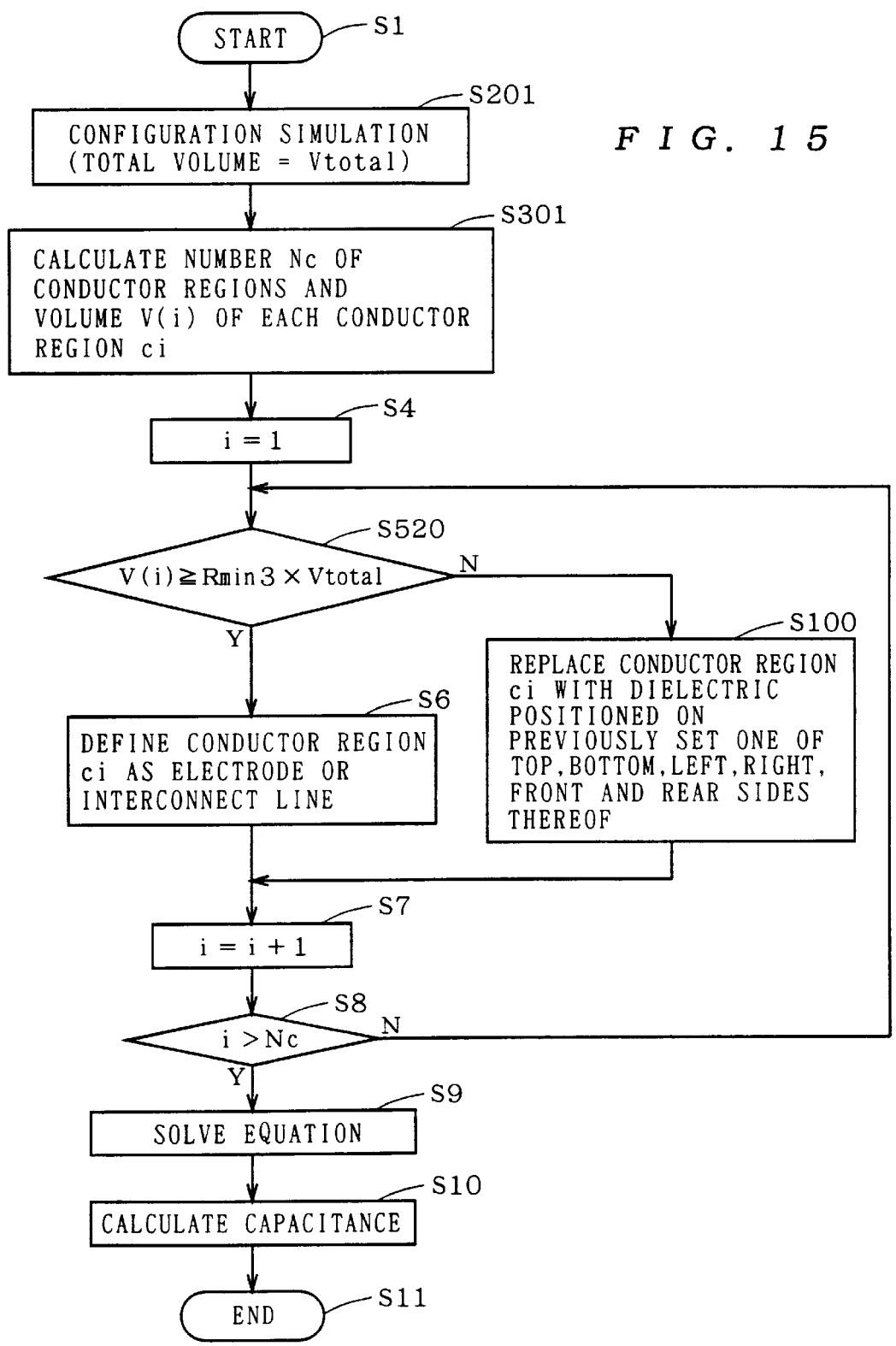
FIG. 15 is a flowchart showing the procedure of a tenth preferred embodiment according to the present invention.

FIG. 15 is a flowchart illustrating the operation of a tenth preferred embodiment according to the present invention.

The tenth preferred embodiment differs from the ninth preferred embodiment in that a step S520 is provided in place of the step S510 of the ninth preferred embodiment. In the step S520, the product of the total volume Vtotal within a range subjected to the configuration simulation and a predetermined rate Rmin3 is used as the minimum volume Vmin in the step S510.

The tenth preferred embodiment, which uses the product of the total volume Vtotal and the predetermined rate Rmin3 to judge whether or not the conductor region is regarded as an error, may perform a high-precision capacitance simulation, like the ninth preferred embodiment. Additionally, the tenth preferred embodiment may make a unified error judgement independently of the dimension of the range of the configuration simulation.

Eleventh Preferred Embodiment

Figure 16:
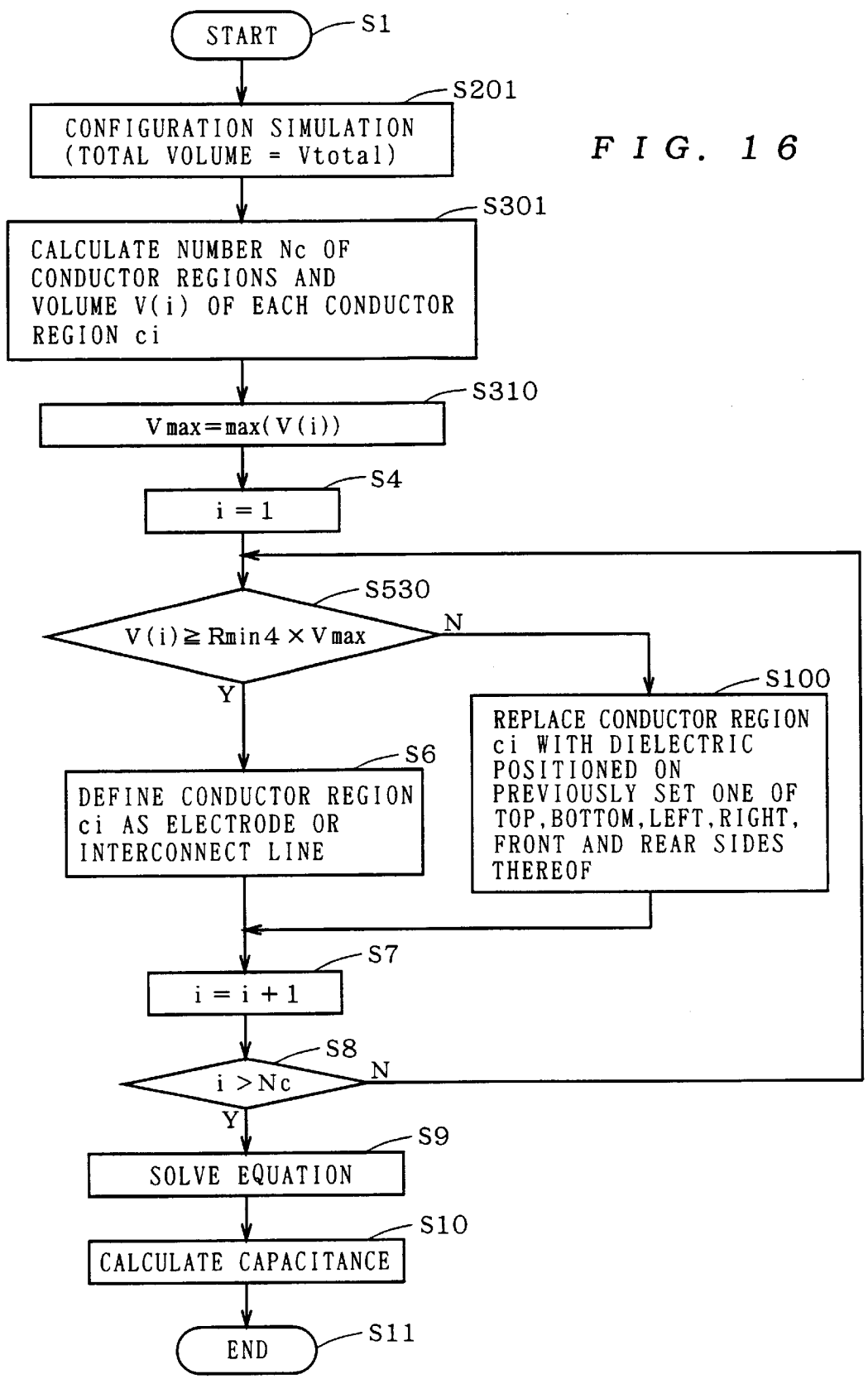
FIG. 16 is a flowchart showing the procedure of an eleventh preferred embodiment according to the present invention.

FIG. 16 is a flowchart illustrating the operation of an eleventh preferred embodiment according to the present invention. The eleventh preferred embodiment differs from the ninth preferred embodiment in that a step S310 is inserted between the steps S3 and S4 of the ninth preferred embodiment and that a step S530 is provided in place of the step S510 of the ninth preferred embodiment.

In the step S310, a maximum value of the volumes V(i) of the respective conductor regions ci is set to Vmax. In the step S530, the product of the maximum value Vmax and a predetermined rate Rmin4 is used as the minimum volume Vmin in the step S510.

The eleventh preferred embodiment, which uses the product of the maximum value of the volumes V(i) of the conductor regions ci and the predetermined rate Rmin4 to judge whether or not the conductor region is regarded as an error, may perform a high-precision capacitance simulation, like the ninth preferred embodiment. Additionally, the eleventh preferred embodiment is particularly advantageous even if the dimension ratio of each of the electrodes and interconnect lines to the range of the simulation is very small when the electrodes and interconnect lines do not have remarkably different dimensions.

Twelfth Preferred Embodiment

Figure 17:
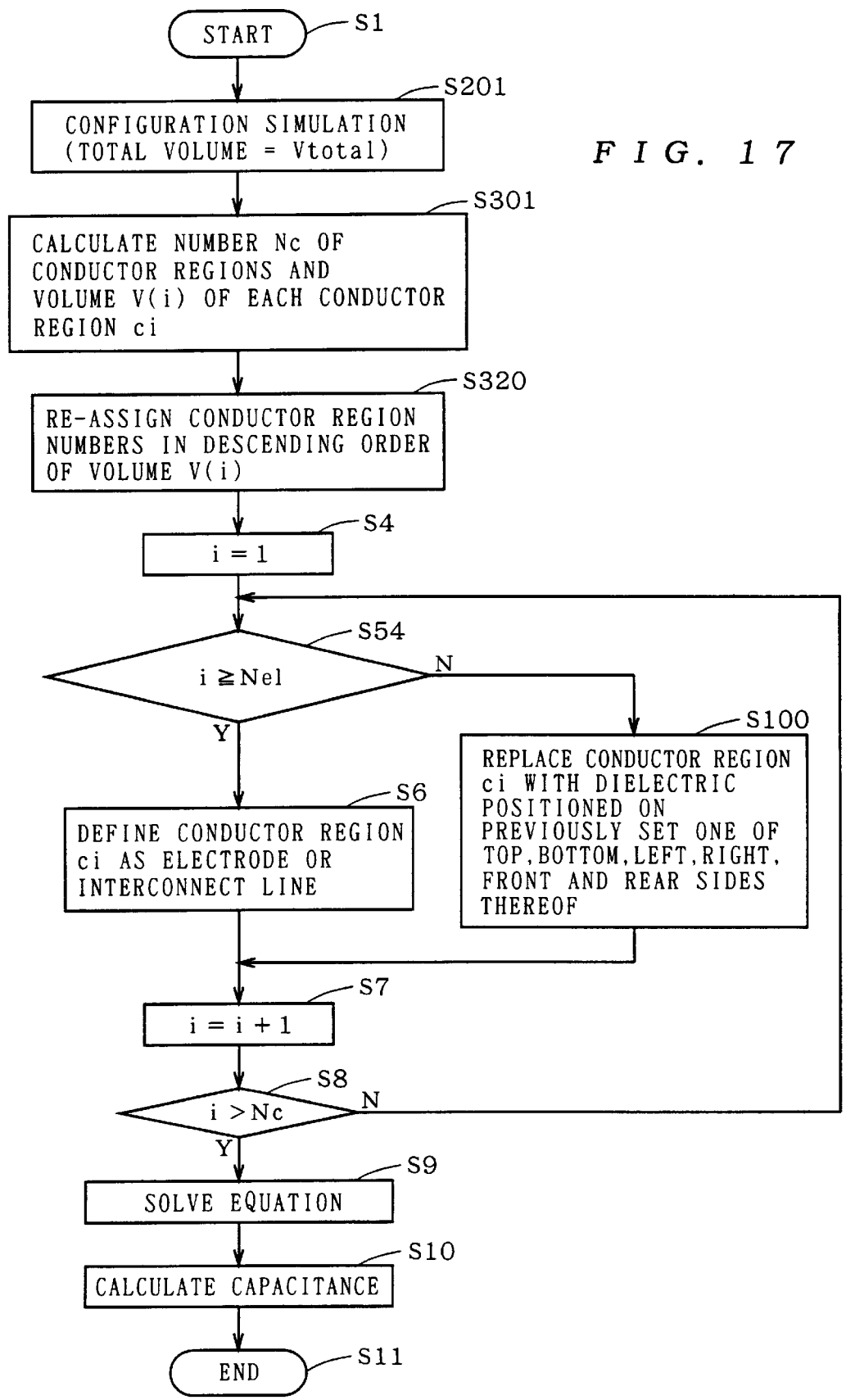
FIG. 17 is a flowchart showing the procedure of a twelfth preferred embodiment according to the present invention.

FIG. 17 is a flowchart illustrating the operation of a twelfth preferred embodiment according to the present invention. The twelfth preferred embodiment differs from the ninth preferred embodiment in that a step S320 is inserted between the steps S3 and S4 of the ninth preferred embodiment and that the step S54 is provided in place of the step S510 of the ninth preferred embodiment.

In the step S320, the conductor region numbers i of the conductor regions ci are re-assigned in descending order of the volume V(i), that is, in the following order:

$$V(1) \geq V(2) \geq \ldots \geq V(Nc) \quad (3)$$

In the step S54, the flow is caused to proceed to the step S6 for a previously established number Nel of conductor regions c1 to cNel which respectively have the highest to Nelth-highest volumes V(i). The Nel conductor regions c1 to cNel are regarded as electrodes or interconnect lines in the step S6. In the step S54, the flow is caused to proceed to the step S100 for the other conductor regions cNel+1 to cNc. The conductor regions cNel+1 to cNc are replaced with their adjacent dielectrics εk in the step S100.

The twelfth preferred embodiment may perform a high-precision capacitance simulation, like the ninth preferred embodiment. Additionally, the twelfth preferred embodiment may readily establish an error judgement criterion when the number of electrodes or interconnect lines in the range subjected to the configuration simulation is known.

Thirteenth Preferred Embodiment

Figure 18:
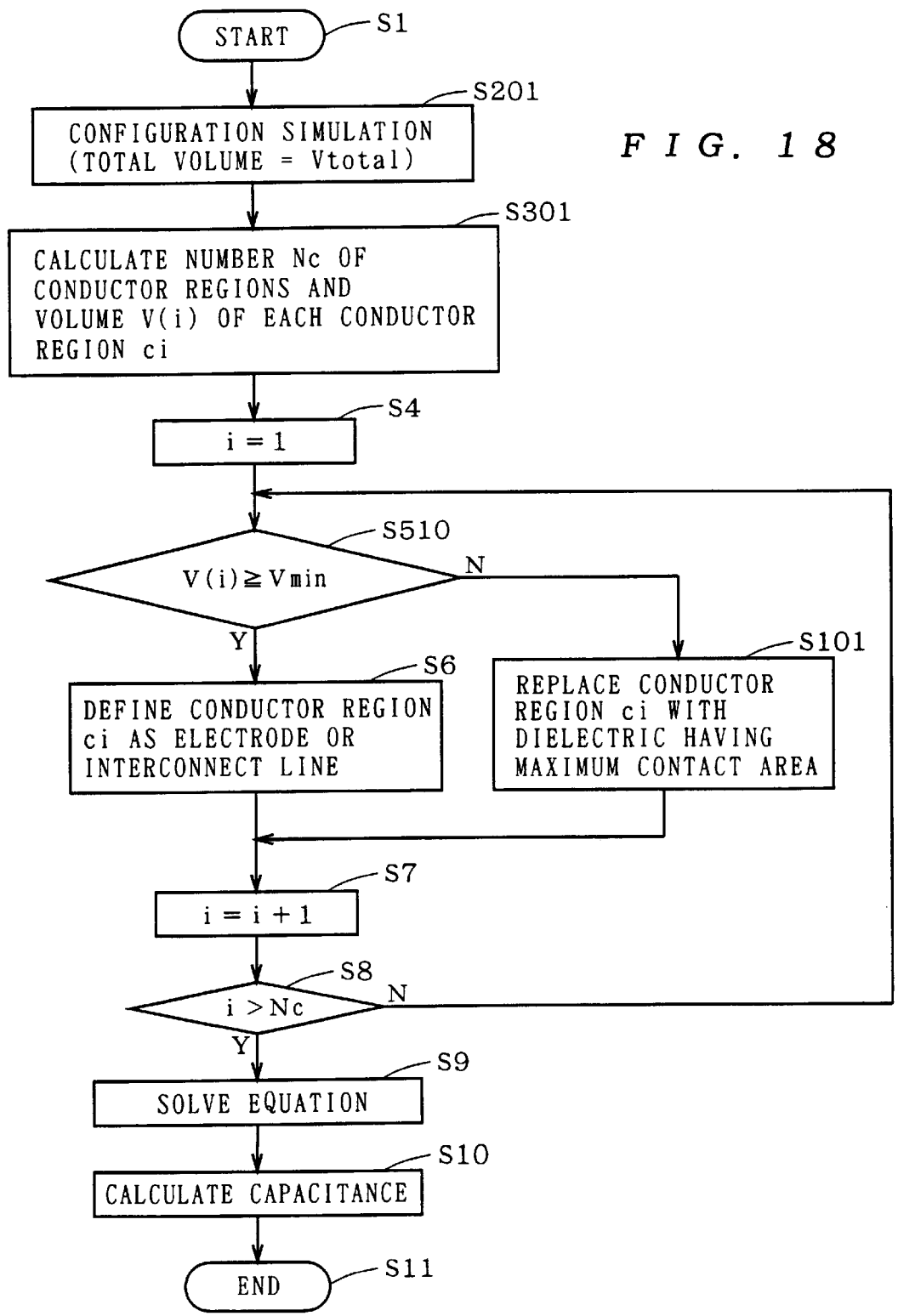
FIG. 18 is a flowchart showing the procedure of the thirteenth preferred embodiment according to the present invention.

FIG. 18 is a flowchart illustrating the operation of a thirteenth preferred embodiment according to the present invention. The thirteenth preferred embodiment differs from the ninth preferred embodiment in that the step S101 is provided in place of the step S100 of the ninth preferred embodiment. The step S101 has been described in detail in the fifth preferred embodiment. The thirteenth preferred embodiment may correct the result of the configuration simulation to perform a high-precision capacitance simulation. Additionally, the thirteenth preferred embodiment provides effects similar to those of the ninth preferred embodiment in that the capacitance simulation is precisely performed when the cells have different volumes depending on the positions thereof. Further, the thirteenth preferred embodiment replaces the conductor region with the dielectric having the greatest area of contact with the conductor region to provide a configuration which is more analogous to the configuration of the actual devices, accomplishing a higher-precision capacitance simulation.

The step S100 of the ninth preferred embodiment, of course, is desirable in terms of simplicity of determination of the dielectric for replacement.

Fourteenth Preferred Embodiment

Figure 19:
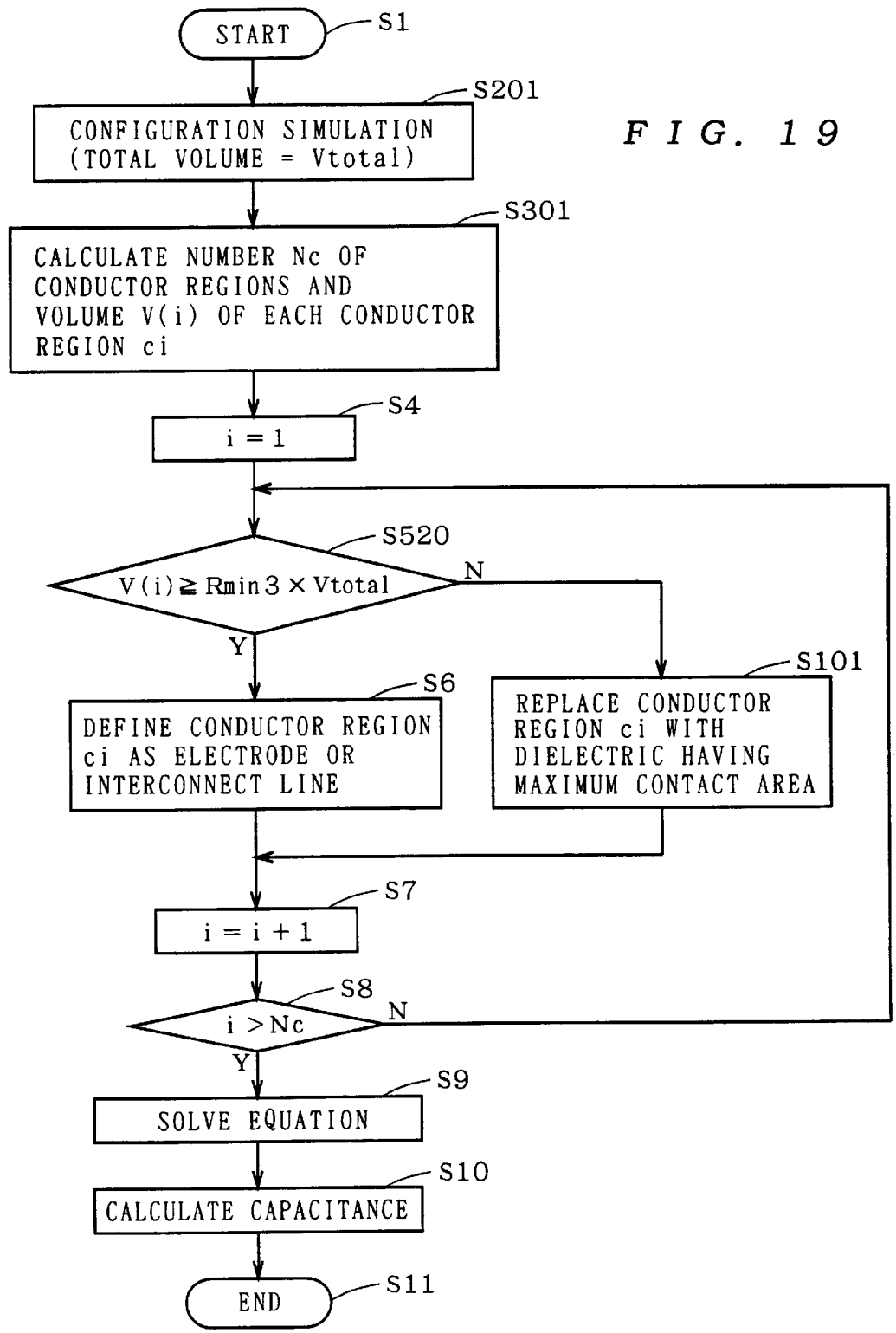
FIG. 19 is a flowchart showing the procedure of the fourteenth preferred embodiment according to the present invention.

FIG. 19 is a flowchart illustrating the operation of a fourteenth preferred embodiment according to the present invention. The fourteenth preferred embodiment differs from the thirteenth preferred embodiment in that the step S520 of the tenth preferred embodiment is provided in place of the step S510 of the thirteenth preferred embodiment. In other words, the fourteenth preferred embodiment differs from the tenth preferred embodiment in that the step S101 of the thirteenth preferred embodiment is provided in place of the step S100 of the tenth preferred embodiment.

Therefore, the fourteenth preferred embodiment, similar to the thirteenth preferred embodiment, may perform a high-precision capacitance simulation. Further, the fourteenth preferred embodiment may precisely perform the capacitance simulation when the cells have different volumes depending on the positions thereof. Additionally, the fourteenth preferred embodiment, similar to the tenth preferred embodiment, may make a unified error judgement independently of the dimension of the range of the configuration simulation.

Fifteenth Preferred Embodiment

Figure 20:
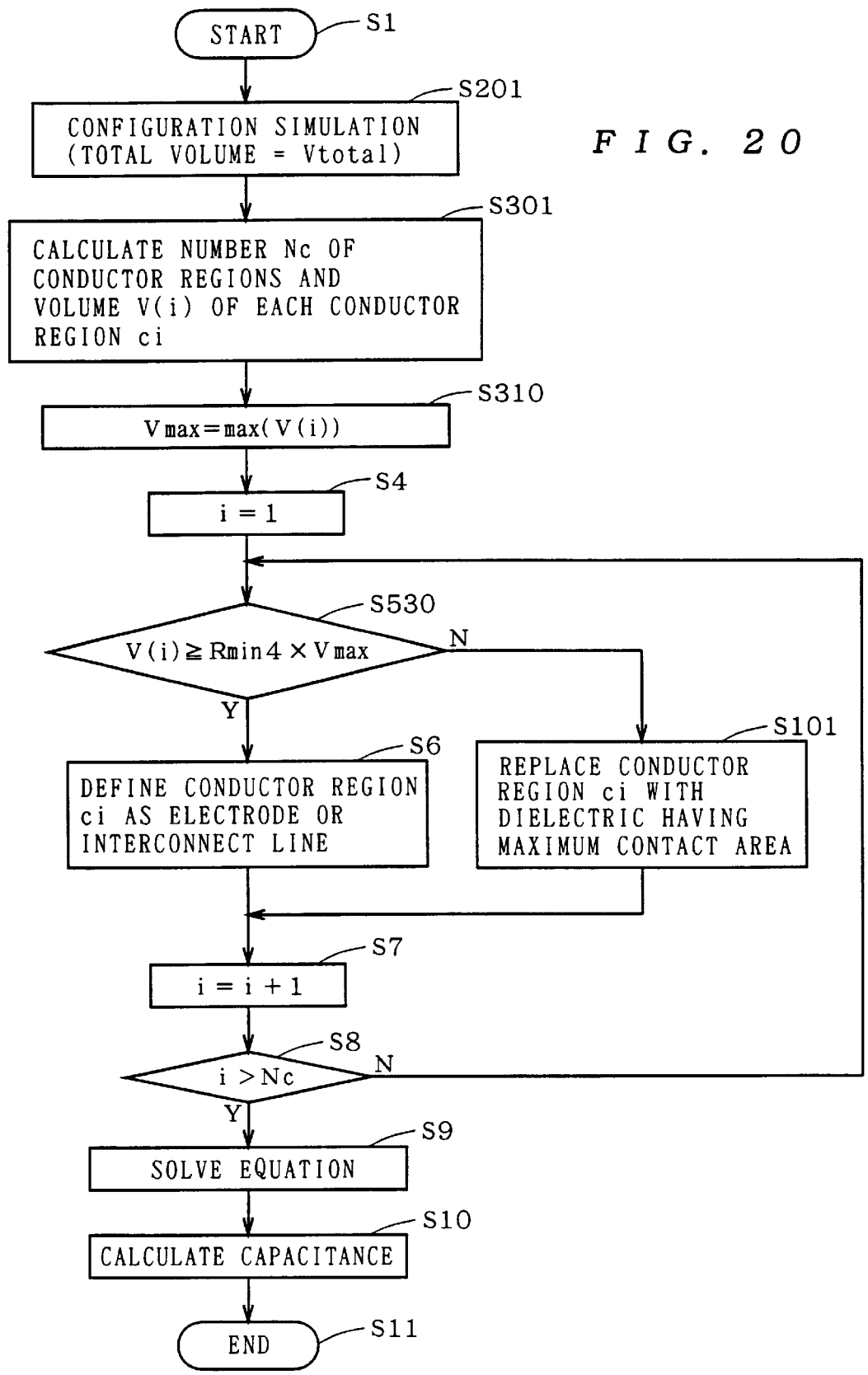
FIG. 20 is a flowchart showing the procedure of the fifteenth preferred embodiment according to the present invention.

FIG. 20 is a flowchart illustrating the operation of a fifteenth preferred embodiment according to the present invention. The fifteenth preferred embodiment differs from the thirteenth preferred embodiment in that the step S310 of the eleventh preferred embodiment is inserted between the steps S3 and S4 of the thirteenth preferred embodiment and that the step S530 of the eleventh preferred embodiment is provided in place of the step S510 of the thirteenth preferred embodiment. In other words, the fifteenth preferred embodiment differs from the eleventh preferred embodiment in that the step S101 of the thirteenth preferred embodiment is provided in place of the step S100 of the eleventh preferred embodiment.

Therefore, the fifteenth preferred embodiment, similar to the thirteenth preferred embodiment, may perform a high-precision capacitance simulation. Further, the fifteenth preferred embodiment may precisely perform the capacitance simulation when the cells have different volumes depending on the positions thereof. Additionally, the fifteenth preferred embodiment, similar to the eleventh preferred embodiment, is particularly advantageous even if the dimension ratio of each of the electrodes and interconnect lines to the range of the simulation is very small when the electrodes and interconnect lines do not have remarkably different dimensions.

Sixteenth Preferred Embodiment

Figure 21:
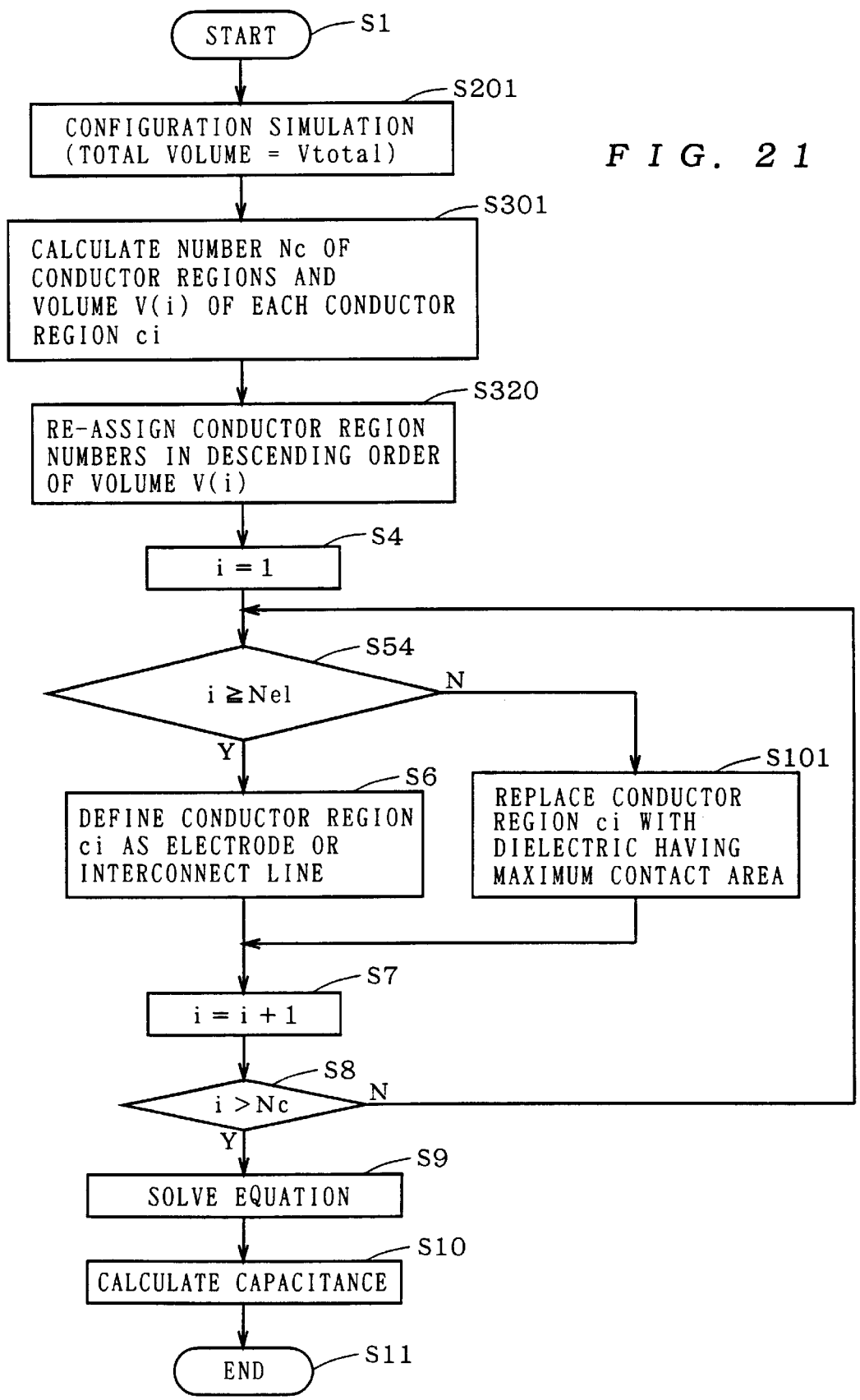
FIG. 21 is a flowchart showing the procedure of the sixteenth preferred embodiment according to the present invention.

FIG. 21 is a flowchart illustrating the operation of a sixteenth preferred embodiment according to the present invention. The sixteenth preferred embodiment differs from the thirteenth preferred embodiment in that the step S320 of the eleventh preferred embodiment is inserted between the steps S3 and S4 of the thirteenth preferred embodiment and that the step S54 of the twelfth preferred embodiment is provided in place of the step S510 of the thirteenth preferred embodiment. In other words, the sixteenth preferred embodiment differs from the twelfth preferred embodiment in that the step S101 of the thirteenth preferred embodiment is provided in place of the step S100 of the twelfth preferred embodiment.

Therefore, the sixteenth preferred embodiment, similar to the thirteenth preferred embodiment, may perform a high-precision capacitance simulation. Further, the sixteenth preferred embodiment may precisely perform the capacitance simulation when the cells have different volumes depending on the positions thereof. Additionally, the sixteenth preferred embodiment, similar to the twelfth preferred embodiment, may readily establish an error judgement criterion when the number of electrodes or interconnect lines in the range subjected to the configuration simulation is known.

Variations and Others

Although the capacitance simulation is used as an example to describe the preferred embodiments, the present invention is, of course, applicable to a method of simulating other electrical characteristics. However, the present invention is particularly effective when the capacitance of an electrode and an interconnect line which is to be calculated is influenced by other conductors such as in the case of the capacitance simulation.

The method of simulating the integrated circuit according to the present invention, in which a multiplicity of cells are subjected to the material replacement, counting of the number of cells and the volume calculation, is suitable for execution using a computer. The method of simulating the integrated circuit according to the present invention may be recorded on a recording medium readable by a computer and thereby readily executed by the computer.

Further, the present invention may be contemplated in terms of the correction of the configuration simulation. The use of a recording medium for recording a program which does not contain the step S2 (or the step S201) but executes only the steps S3 through S8 (or the steps S301 through S8) and the linkage of the recording medium with the conventional configuration simulation are contemplated within the scope of the present invention.

While the invention has been described in detail, the foregoing description is in all aspects illustrative and not restrictive. It is understood that numerous other modifications and variations can be devised without departing from the scope of the invention.

I claim:

1. A method of simulating an integrated circuit, comprising the steps of:

defining a set of unit regions based on a structure of an integrated circuit, each of said unit regions including information related to a material and a position thereof;

identifying as a conductor region each cell-coupled element comprised of at least one of said unit regions which is made of a conductor material;

calculating a number of unit regions included in said conductor region;

judging, based on the number of unit regions included in said conductor region, if the conductor region satisfies a criterion for regarding said conductor region as an electrode region or an interconnect line region;

replacing the information related to the material of said at least one of said unit regions included in said conductor region with information related to a nonconductor when said conductor region does not satisfy said criterion; and solving a predetermined equation using the information related to the material and position of said unit regions including said at least one of said unit regions in which the information related to the material has been replaced in said replacing step to determine physical properties of said integrated circuit.

2. The method according to claim 1, wherein said criterion comprises whether or not the number of unit regions included in said conductor region is greater than or equal to a previously set value.

3. The method according to claim 2, wherein said set value comprises a product of the total number of unit regions within an entire region to be simulated and a predetermined rate.

4. The method according to claim 2, wherein said set value comprises a product of a maximum number of unit regions included in any conductor region and a predetermined rate.

5. The method according to claim 1, wherein said criterion comprises a ranking of said conductor region relative to other conductor regions, said ranking based on the number of unit regions included in a plurality of conductor regions.

6. A method of simulating an integrated circuit, comprising the steps of:

defining a set of unit regions based on a structure of an integrated circuit, each of the unit regions including information related to a material and a position thereof;

identifying as a conductor region each cell-coupled element comprised of at least one of said unit regions which is made of a conductor material; and calculating the total number of conductor regions and the volume of each conductor region in the case of a three-dimensional simulation and the area of each conductor region in the case of a two-dimensional simulation;

judging whether or not the volume of each conductor region satisfies a criterion for regarding each conductor region as an electrode region or an interconnect line region in the case of said three-dimensional simulation and judging whether or not the area of each conductor region satisfies a criterion for regarding each conductor region as said electrode region or an interconnect line region in the case of said two-dimensional simulation;

replacing the information related to the material of said at least one of said unit regions included in each conductor region with information related to a nonconductor when said conductor region does not satisfy said criterion; and solving a predetermined equation using the information related to the material and position of said unit regions including said at least one of said unit regions in which the information related to the material has been replaced in said replacing step to determine physical properties of said integrated circuit.

7. The method according to claim 6,
wherein said criterion in the case of said three-dimensional simulation comprises whether or not the volume of each conductor region is greater than or equal to a previously set volume value, and said criterion in the case of said two-dimensional simulation comprises whether or not the area of each conductor region is greater than or equal to a previously set area value.

8. The method according to claim 7,
wherein said set volume value in the case of said three-dimensional simulation comprises a product of the volume of an entire region to be simulated and a predetermined rate, and said set area value in the case of said two-dimensional simulation comprises a second product of the area of the entire region to be simulated and a second predetermined rate.

9. The method according to claim 7,
wherein said set volume value in the case of said three-dimensional simulation comprises a product of a maximum volume of any conductor region and a predetermined rate, and said set area value in the case of said two-dimensional simulation comprises a second product of a maximum area of any conductor region and a second predetermined rate.

10. The method according to claim 6,
wherein said criterion in the case of said three-dimensional simulation comprises a volume ranking of each conductor region relative to other conductor regions, said volume ranking based on the volume of each conductor region, and said criterion in the case of said two-dimensional simulation comprises an area ranking of each conductor region relative to other conductor regions, said area ranking based on the area of each conductor region.

11. The method according to claim 1,
wherein, said at least one of said unit regions included in said conductor region being adjacent to surrounding unit regions of said unit regions, said surrounding unit regions having boundaries defining an outermost surface of said at least one of said unit regions included in said conductor region, information related to said at least one of said unit regions being replaced with the information related to the material of one of said surrounding unit regions of said unit regions, the boundary of one of said surrounding unit regions of said unit regions being oriented in a previously set direction.

12. The method according to claim 6,
wherein said at least one of said unit regions included in each conductor region to be replaced in said replacing step being adjacent to surrounding unit regions of said unit regions, said surrounding unit regions having boundaries defining an outermost surface of said at least one of said unit regions included in each conductor region, information related to said at least one of said unit regions being replaced with the information related to the material of one of said surrounding unit regions of said unit regions, the boundary of one of said surrounding unit regions of said unit regions being oriented in a previously set direction.

13. The method according to claim 1, wherein said replacing step comprises the steps of:
determining a boundary between said conductor region not satisfying said criterion and at least one adjacent region adjacent to said conductor region not satisfying said criterion; and replacing the information related to the material of said conductor region not satisfying said criterion with information related to a type of the material forming said adjacent region having a largest boundary with said conductor region not satisfying said criterion.

14. The method according to claim 6, wherein said replacing step comprises the steps of:
determining a boundary between each conductor region not satisfying said criterion and at least one adjacent region adjacent to each conductor region not satisfying said criterion; and replacing the information related to the material of each conductor region not satisfying said criterion with information related to a type of the material forming said adjacent region having a largest boundary.

15. A computer readable recording medium which records thereon a program embodying the steps of:
representing a structure of an integrated circuit with a set of unit regions each including information related to a material and a position thereof;

identifying a conductor region comprised of at least one of said unit regions comprising a conductor;

judging whether or not said conductor region satisfies a criterion for regarding said conductor region as an electrode region or an interconnect line region;

replacing the information related to the material of said at least one of said unit regions included in said conductor region with information related to a nonconductor when said conductor region does not satisfy said criterion; and solving a predetermined equation using the information related to the material and position of said unit regions including said at least one of said unit regions in which the information related to the material has been replaced in said replacing step to determine physical properties of said integrated circuit.

16. The computer readable recording medium according to claim 15, wherein;
the number of unit regions included in said conductor region being calculated in said representing step; and said criterion in said judging step comprises whether or not a number of unit regions included in said conductor region is greater than or equal to a previously set value.

17. The computer readable recording medium according to claim 15, wherein;
the number of unit regions included in said conductor region being calculated in said representing ste; and said criterion in said judging step comprises a ranking of a plurality of conductor regions based on a number of unit regions included in each conductor region.

18. The computer readable recording medium according to claim 15, wherein;
the volume of said conductor region being calculated in said representing step in a three-dimensional simulation, and the area of said conductor region being calculated in said representing step in a two dimensional simulation; and said criterion in said judging step in said three-dimensional simulation comprises whether or not the volume of said conductor region is greater than or equal to a previously set volume value, and said criterion in said judging step in said two-dimensional simulation comprises whether or not the area of said conductor region is greater than or equal to a previously set area value.

19. The computer readable recording medium according to claim 15, wherein;

the volume of said conductor region is calculated in said representing step in a three-dimensional simulation, and the area of said conductor region is calculated in said representing step in a two-dimensional simulation; and said criterion in said judging step in said three-dimensional simulation comprises a volume ranking of a plurality of conductor regions, and said criterion in said judging step in said two-dimensional simulation comprises an area ranking of a plurality of conductor regions.

* * * * *